United States Patent
Papandreou et al.

(10) Patent No.: US 9,865,340 B2
(45) Date of Patent: *Jan. 9, 2018

(54) ENHANCED TEMPERATURE COMPENSATION FOR RESISTIVE MEMORY CELL CIRCUITS

(71) Applicant: International Business Machines Corporation, Armonk, NY (US)

(72) Inventors: Nikolaos Papandreou, Thalwil (CH); Charalampos Pozidis, Thalwil (CH); Milos Stanisavljevic, Adliswil (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/366,386

(22) Filed: Dec. 1, 2016

(65) Prior Publication Data
US 2017/0125096 A1 May 4, 2017

Related U.S. Application Data

(63) Continuation of application No. 14/926,569, filed on Oct. 29, 2015, now Pat. No. 9,520,189.

(51) Int. Cl.
*G11C 11/00* (2006.01)
*G11C 13/00* (2006.01)
*G11C 11/56* (2006.01)

(52) U.S. Cl.
CPC ...... *G11C 13/0033* (2013.01); *G11C 11/5678* (2013.01); *G11C 13/0004* (2013.01); *G11C 13/004* (2013.01); *G11C 13/0069* (2013.01)

(58) Field of Classification Search
CPC ............ G11C 11/5678; G11C 13/0004; G11C 13/004; G11C 13/0069; G11C 13/0033; G11C 11/5642; G11C 23/0021; G11C 13/0023; G11C 13/0026; G11C 7/04
USPC ..... 365/148, 163, 158, 171, 185.03, 189.06, 365/189.15, 196
See application file for complete search history.

(56) References Cited

U.S. PATENT DOCUMENTS

| | | | |
|---|---|---|---|
| 9,343,148 B2 * | 5/2016 | Papandreou | G11C 13/004 |
| 9,496,031 B2 * | 11/2016 | Papandreou | G11C 13/004 |
| 9,520,189 B1 * | 12/2016 | Papandreou | G11C 13/0033 |
| 2016/0372187 A1 * | 12/2016 | Papandreou | G11C 13/004 |

OTHER PUBLICATIONS

List of IBM Patents or Patent Applications Treated as Related, U.S. Appl. No. 15/366,386, filed Dec. 1, 2016, 2 Pages.
U.S. Appl. No. 14/926,569, filed Oct. 29, 2015; "Enhanced Temperature Compensation for Resistive Memory Cell Circuits".

* cited by examiner

*Primary Examiner* — Gene Auduong
(74) *Attorney, Agent, or Firm* — Cantor Colburn LLP; Daniel Morris

(57) ABSTRACT

A computer-implemented method for performing a voltage-based measurement of a resistive memory cell having a plurality of programmable cell states includes providing, via a processor, a prebiased voltage at a connecting node. The method further includes prebiasing a bitline capacitance of the resistive memory cell. In other aspects, the method includes settling, via the processor, a sensing circuit to a target voltage. The method further includes outputting a resultant value based on a sensed voltage at the resistive memory cell.

20 Claims, 19 Drawing Sheets

ENHANCED TEMPERATURE COMPENSATION FOR RESISTIVE MEMORY CELL CIRCUITS

DOMESTIC PRIORITY

This application is a continuation of U.S. application Ser. No. 14/926,569, entitled, "ENHANCED TEMPERATURE COMPENSATION FOR RESISTIVE MEMORY CELL CIRCUITS," filed Oct. 29, 2015, the disclosure of which is incorporated by reference herein in its entirety.

BACKGROUND

The present disclosure relates to memory cell circuits, and more specifically, to enhanced temperature compensation for resistive memory cell circuits.

A prominent example for resistive memory cells having a plurality of programmable levels or states is Resistive Random Access Memory (RRAM), and more particularly, Phase Change Memory (PCM). PCM is a non-volatile solid-state memory technology that exploits the reversible, thermally-assisted switching of specific chalcogenides between certain states of different electrical conductivity.

PCM is a non-volatile memory technology having low latency, high endurance, long retention and high scalability. PCM may utilize multi-level cell functionality to accomplish a low cost per bit, high-speed read/write operations, and high bandwidth and high endurance. Multilevel functionality (for example, multiple bits per PCM cell) may be a way to increase storage capacity and thereby to reduce cost.

Multi-level PCM may store multiple resistance levels between a lowest (SET) and a highest (RESET) resistance value at each memory cell. Multiple resistance levels (described hereafter as "levels") correspond to partial-amorphous and partial-crystalline phase distributions of the PCM cell. Phase transformation (such as, for example, memory programming) may be enabled by Joule heating. In this regard, Joule heating can be controlled by a programming current or voltage pulse. For example, the multiple states or levels in a PCM cell may be created by varying the programming power, thus creating different crystalline and amorphous fractions within the memory cell. In metal-oxide resistive memory devices, multiple states may correspond to variations in the gap between conductive oxygen-vacancy filaments and the electrodes.

In resistive memory, the fundamental storage unit (referred to generally herein as the "cell") can be set to a number of different states which exhibit different electrical resistance characteristics. Information may be recorded in the cells by exploiting the different material states to represent different data values. For example, to read recorded data, cell-state can be detected via measurements that exploit the differing resistance characteristics in order to differentiate between possible cell-states. Some semiconductor memory technologies may employ these basic principles for data storage, including oxide-based memory techniques using resistive RAM and memristor memory, ionic-transport-based memory, and phase-change memory.

Phase-change memory exploits the reversible switching of certain chalcogenide materials between at least two states with different electrical resistance. In single-level cell (SLC) PCM devices, each cell can be set to one of two states, crystalline and amorphous, by application of heat. Each SLC cell can thus store one bit of binary information. Storage of more than one bit per cell may be advantageous. A cell can be set to m states where m>2, and these states can be distinguished on readback via the cell resistance characteristics. In some aspects, multi-level cells (MLCs) can be set to one of m>2 resistance levels, each corresponding to a different cell state. MLC operation is achieved by exploiting partially-amorphous states of the chalcogenide cell. Different cell states can be set by varying the effective volume of the amorphous phase within the chalcogenide material. This in turn varies cell resistance.

To write data to a PCM cell, a PCM memory system may apply a voltage or current pulse to the cell to heat the chalcogenide material to an appropriate temperature to induce the desired cell-state on cooling. By varying the amplitude of the voltage or current pulses, different cell-states can be achieved. PCM memory systems may read a value at each PCM cell using cell resistance to distinguish the different cell-states. The PCM system may measure resistance for a read operation in the sub-threshold region of the current-versus-voltage (I-V) characteristic of the cell, e.g., in the region below the threshold switching voltage at which a change in cell-state can occur. A PCM system may read measurement in a variety of ways, but most techniques rely fundamentally on either voltage biasing and current sensing, or current biasing and voltage sensing. In a simple implementation of the current-sensing approach, the PCM system may bias the cell at a certain constant voltage level and sense the resulting cell current to provide a current-based metric for cell-state. PCM systems may read an output of the cell state by measuring the cell current at a known voltage. Said in other way, using conventional methods the PCM system may read the cell output by measuring a current through the cell. This solution works fine as long as one is only interested in distinguishing among a few levels that may be widely separated.

Reading MLC cells can be particularly challenging because the read operation can involve distinguishing fine differences in cell resistance via the current/voltage measurements. For example, resistance may drift to a higher resistance level with the passing of time. Resistance drift is a characteristic phenomenon observed in phase-change memory cells, which manifests itself as a steady increase in the electrical resistance of the stored cell-state over time. Drift can adversely affect the reliability of MLC storage in PCM, because the distance between adjacent levels is small and stochastic fluctuations of the resistance may be more likely to cause level overlap over time than in binary storage. Compared to SLC operation, these fine differences may be more affected by random noise fluctuations and the resistance drift, resulting in errors when retrieving stored data. To counteract this loss of data integrity associated with MLC memory, enhanced cell-state metrics can be used to compensate for the loss of data integrity.

One such used enhanced metric focuses on the sub-threshold slope of the I/V characteristic of the cell. Using this method the metric can be based on the difference between two read measurements of the same cell. This type of metric may be less sensitive to noise and drift. The metric can be a voltage based metric in the sense that it calls for the measurement of cell voltages (or cell voltage differences) at given bias currents. In general, voltage-based metrics may be advantageous over current-based metrics because the voltage-based metrics can result in less resistance drift over time, less susceptibility to noise, better SNR (signal-to-noise ratio), and may allow more intermediate levels to be packed into one cell.

However, the conventional techniques for obtaining voltage-based metrics (using current biasing and voltage sensing) may be undesirably slow. Since PCM devices may store multiple bits of information per cell, the distinguished levels may be tightly spaced. Voltage-based metrics are often used in order to pack more levels per cell, and provide more reliable readings for tightly-spaced levels. From a circuit-level perspective the standard solution of biasing the cells at a constant current and digitalizing the measured voltage may carry with it a significant cost in processing speed. This speed penalty associated with the conventional voltage measurement technique means that there may be a fundamental conflict between the requirement for a fast random access of the memory and the need for voltage-based metrics supporting high density MLC memory. For example, the hybrid approach may use a voltage-biased search loop to acquire target biasing current even though being significantly faster than other solution may not provide sufficient speed improvement to be comparable with current-based metric solutions and used in next generation of memory-based storage systems.

PCM memory is often subject to wide range of operating temperatures that can adversely affect PCM cell state readings, which are correlated to the operating temperature of the cell (even more than to the resistance drift). In addition to, each cell state may have different sensitivity to the temperature, which could provide inaccurate readouts when temperature varies. It may be advantageous to optimize voltage-based measurements for PCM cell state readings that can provide consistently accurate measurements at all operational temperatures.

SUMMARY

According to some embodiments, a computer-implemented method for performing a voltage-based measurement of a resistive memory cell having a plurality m of programmable cell states. The method may include providing, via a processor, a prebiased voltage at a connecting node coupled to the resistive memory cell, coupling, via the processor, a resistor circuit in parallel to the resistive memory cell such that the resistor is configured to reduce an effective resistance at the connecting node of the prebiasing circuit, prebiasing a bitline capacitance of the resistive memory cell by the prebiasing circuit, settling, via the processor, a sensing circuit to a target voltage by connecting the sensing circuit to one of a plurality of settling circuits, wherein the one of the plurality of settling circuits is selected based on a temperature reading of the resistive memory cell, sensing a voltage of the resistive memory cell, and outputting a resultant value based on the sensed voltage.

According to other embodiments, a system for performing a voltage-based measurement of a resistive memory cell having a plurality m of programmable cell states is described. The system may include a processor configured to provide a prebiased voltage at a connecting node coupled to the resistive memory cell, couple a resistor circuit in parallel to the resistive memory cell such that the resistor is configured to reduce an effective resistance at the connecting node of the prebiasing circuit, prebias a bitline capacitance of the resistive memory cell by the prebiasing circuit, settle a sensing circuit to a target voltage by connecting the sensing circuit to one of a plurality of settling circuits, wherein the one of the plurality of settling circuits is selected based on a temperature reading of the resistive memory cell, sense a voltage of the resistive memory cell and output a resultant value based on the sensed voltage.

A computer program product for performing a voltage-based measurement is described. The computer program product may include a computer readable storage medium having program instructions embodied therewith, where the computer readable storage medium is not a transitory signal per se. The program instructions may be executable by a processor to cause the processor to perform a method. The method may include providing, via the processor, a prebiased voltage at a connecting node coupled to the resistive memory cell, coupling, via the processor, a resistor circuit in parallel to the resistive memory cell such that the resistor is configured to reduce an effective resistance at the connecting node of the prebiasing circuit, prebiasing a bitline capacitance of the resistive memory cell by the prebiasing circuit, settling, via the processor, a sensing circuit to a target voltage by connecting the sensing circuit to one of a plurality of settling circuits, wherein the one of the plurality of settling circuits is selected based on a temperature reading of the resistive memory cell, sensing a voltage of the resistive memory cell, and outputting a resultant value based on the sensed voltage.

BRIEF DESCRIPTION OF THE DRAWINGS

The subject matter regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
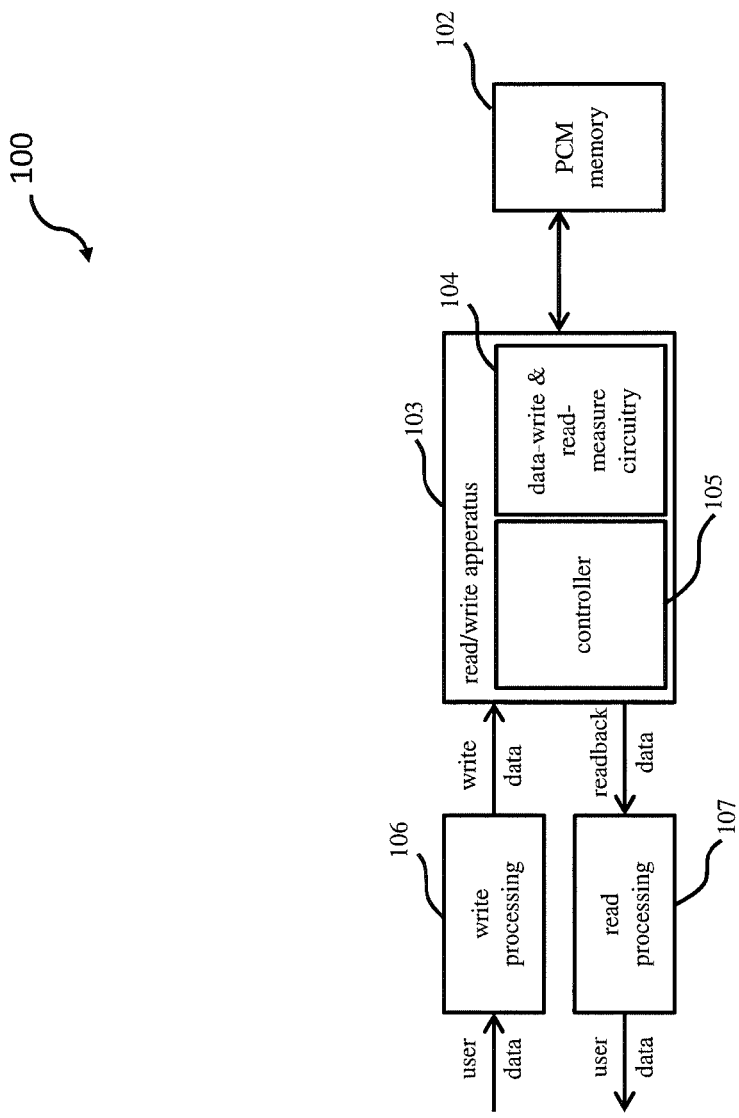
FIG. 1 is a block diagram for a resistive memory device in accordance with some exemplary embodiments.

FIG. 1 is a flow diagram for a resistive memory device 100, in accordance with some exemplary embodiments. Resistive memory device 100 may include a phase-change material (PCM) memory 102 for storing data in one or more integrated arrays of multilevel PCM cells. Device 100 may further include a read/write apparatus 103, a data-write and read-measure circuitry 104, a controller 105, a write processing apparatus 106, and a read processing apparatus 107.

Though shown as a single block in FIG. 1, memory 102 may include any desired configuration of PCM storage units ranging from a single chip comprising a plurality of PCM cells organized as a memory storage bank, to a die to a plurality of storage banks each containing multiple packages of storage chips. Device 100 may read and write data to memory 102 by read/write apparatus 103.

Read/write apparatus 103 may include measurement circuitry 104 for writing data to the PCM cells and for making cell measurements allowing determination of cell state and read stored data. Circuitry 104 may be configured to address individual PCM cells for write and read purposes by applying appropriate voltage and/or current signals to an array of word and bit lines in PCM memory 102.

Read/write controller 105 may control operation of apparatus 103 and may control measurement operations in the embodiments to be described, as well as processing of measurements for determining cell state, e.g., with respect to level detection. In general, device 100 may implement the functionality of controller 105 in hardware or software or a combination thereof, though use of hardwired logic circuits is generally preferred for reasons of operating speed. Suitable implementations will be apparent to those skilled in the art from the description herein.

Device 100 may receive user data input through write processing device 106, such as, for example, for error-correction purposes, before being supplied as write data to read/write apparatus 103. Similarly, device 100 can read data output via read-processing device 107, such as, for example, by performing code word detection and error correction operations to recover the original input user data. Devices 106 and 107 may be configured to process information independently from of the cell-state measurement system to be described and need not be discussed further here.

According to some embodiments, device 100 may set each of the multilevel cells in PCM memory 102 to one of m resistance levels, where m>2, corresponding to different amorphous/crystalline states of each cell. To write data to memory cells, circuitry 104 may apply programming pulses (via cell bit-lines or word-lines depending on whether voltage-mode or current-mode programming is used) of appropriate amplitude to set cells to states representative of the write data. Subsequent reading of a memory cell may include determining the state of the cell, such as, for example, detecting which of the possible levels that cell is set to. In a read operation of memory device 100, circuitry 104 may perform cell measurements from which cell-states can be determined and the stored data recovered.

Figure 2:
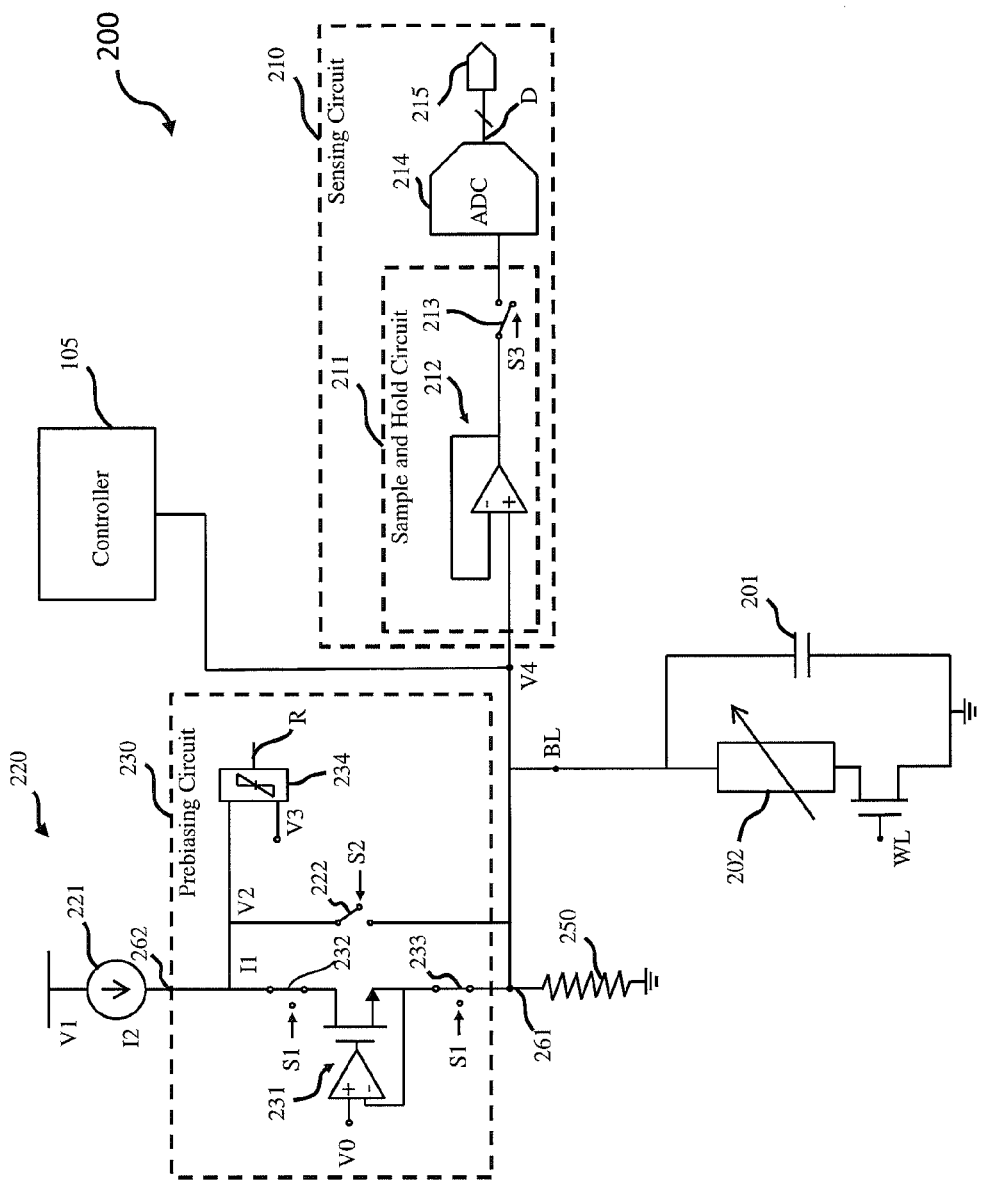
FIG. 2 is a circuit diagram of a device for determining an actual cell state of a resistive memory cell in a prebiasing mode in accordance with some exemplary embodiments.

Referring now to FIG. 2, a circuit diagram of a device 200 for determining an actual cell state of a resistive memory cell in a prebiasing mode is depicted, in accordance with some exemplary embodiments. Device 200 may include a sensing circuit 210, a settling circuit 220, a prebiasing circuit 230 and a resistor 250. Resistor 250 can be coupled in parallel to the resistive memory cell 202 (also referred to hereafter as "PCM cell 202"). Resistive memory cell 202 may be a PCM cell having a plurality M of programmable cell states.

Sensing circuit 210 may be configured to sense a sensing voltage V4 of the resistive memory cell 202 and output a resultant value D (e.g. a digital value D) in response to the sensing voltage V4. The sensing voltage V4 and therefore also the resultant value D may be indicative of the actual cell state.

Sensing circuit 210 may include a sample and hold circuit 211, an analog-to-digital converter (ADC) 214 and an output 215. Sample and hold circuit 211 can include a buffer 212 and a switch 213 controlled by control signal S3.

Settling circuit 220 can be configured to settle the sensing voltage V4 to a certain target voltage representing one of the M programmable cell states. The settling circuit 220 may be coupled to a supply voltage V1 and includes a current mirror 221.

Prebiasing circuit 230 may be coupled between current mirror 221 and a first node 261 connecting prebiasing circuit 230 to sensing circuit 210. Resistor 250 may be coupled in parallel to resistive memory cell 202 and therefore also be connected to node 261. Resistive memory cell 202 can include a bitline BL, a bitline capacitance 201 and a word-line WL. Bitline BL of PCM cell 202 may be connected to node 261.

According to some embodiments, the resistance of resistor 250 may be at least 5 times smaller than a highest resistance value of the resistive memory cell 202. For example, the resistance of the resistor 250 may be between 5 and 15 times smaller than a highest resistance value of the resistive memory cell 202.

In some aspects, prebiasing circuit 230 may include a voltage regulator 231 which may be coupled to a second node 262, which may be in turn connected to settling circuit 220 by a switch 232. Furthermore, the prebiasing circuit 230 may be coupled to node 261 by a second switch 233.

In some embodiments, controller 105 may be configured to control the number of switches 222, 232, 233 such that, in a prebiasing phase (or prebiasing mode), the prebiasing circuit 230 can be connected to the first node 261 and, in a settling phase (or settling mode), the settling circuit 220 can be connected to the first node 261 and the prebiasing circuit 230 is disconnected from the first node 261 and second node 262.

In other aspects, controller 105 may control the switches 232 and 233 by a first control signal S1. Furthermore, controller 105 may control the switch 222 by a second control signal S2. Control signals S1 and S2 may be complementary signals. Moreover, controller 105 may control switch 213 by the third control signal S3.

In some embodiments, prebiasing circuit 230 can include a comparator 234 for providing a comparison result R based on comparing a first current I1 flowing through the resistive memory cell 202 and the resistor 250 and a second current I2 provided by the current mirror 221.

In some aspects, comparator 234 may be a voltage comparator 234. Voltage comparator 234 may be configured to provide the comparison result R by comparing an output voltage V2 provided by the current mirror 221 and a reference voltage V3 (e.g., V3=0.5V1).

Figure 3A:
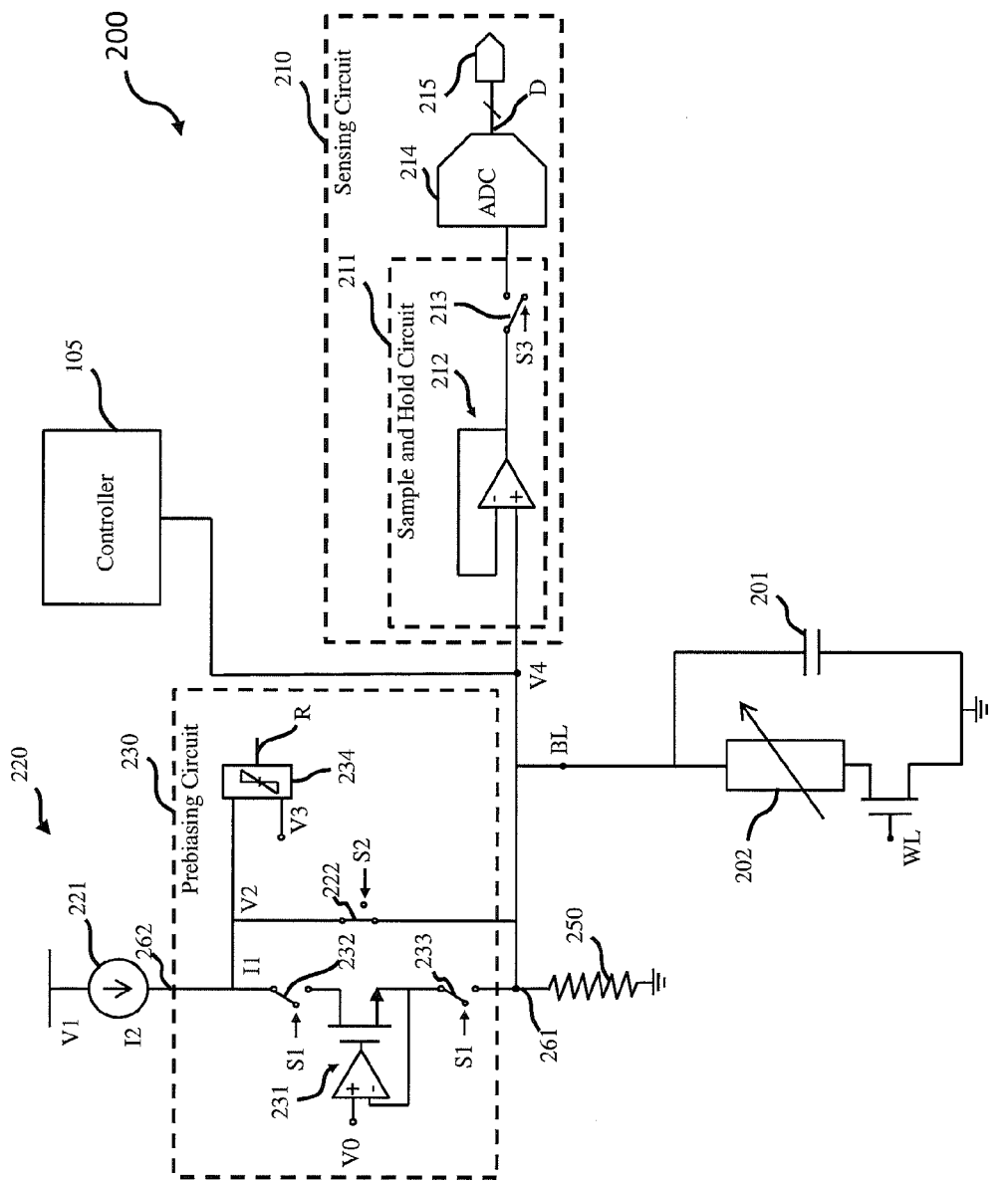
FIG. 3A is a circuit diagram for the device of FIG. 2 in a settling mode in accordance with some exemplary embodiments.
Figure 3B:
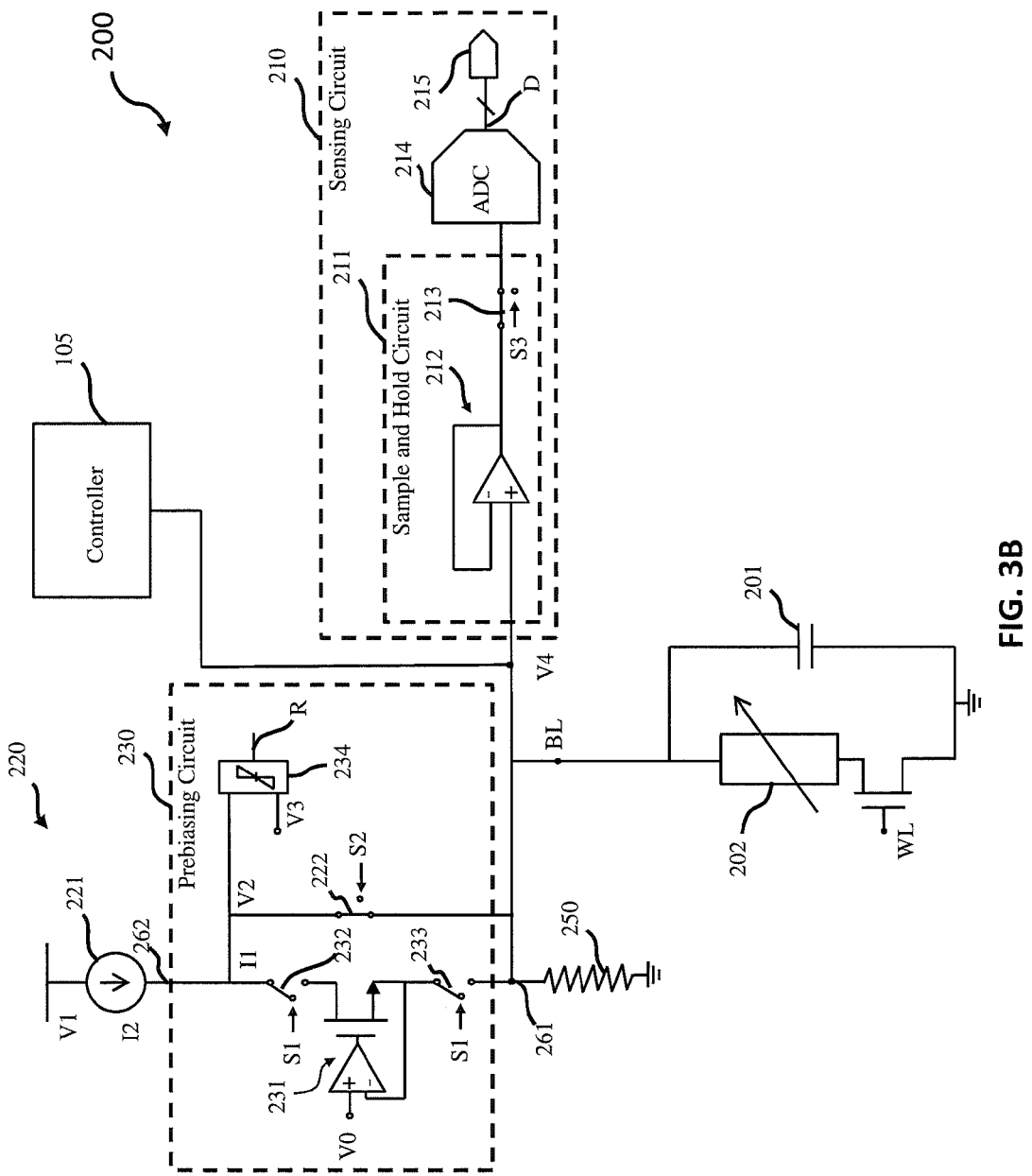
FIG. 3B is a circuit diagram of the device of FIG. 2 in a sampling mode in accordance with some exemplary embodiments.

According to various embodiments, responsive to comparison result R device 200 may be configured to a prebiasing mode (FIG. 2), or in a settling mode (see FIG. 3A), or in a sampling mode (FIG. 3B). In some aspects, sampling mode may differ from the settling mode of FIG. 3A in that the switch 213 may be closed in the sampling mode. Thus, the switched configuration of FIG. 3B may be the same as in FIG. 3A except that switch 213 is closed.

With respect to FIG. 2, FIG. 3A and FIG. 3B, controller 105 may be configured to control the number of switches 222, 232, 233 such that the prebiasing circuit 230 can be connected to the first node 261 as long as the comparison result R indicates that the first current I1 is smaller than the second current I2 (see, e.g., prebiasing mode as depicted in FIG. 2). Furthermore, if the comparison result R indicates that first current I1 is greater than or equal to second current I2, the controller 105 may control the number of switches 222, 232, 233 such that the settling circuit 220 is connected to the first node 261 and the prebiasing circuit 230 is disconnected from the first node 261 and second node 262 (see FIG. 3, settling mode).

In particular, according to some embodiments, during the prebiasing phase depicted in FIG. 2, controller 105 may feed a predetermined number N of gradual rising biasing voltages V0 to prebiasing circuit 230, namely to the positive input of the voltage regulator 231. In particular, the number N of gradual rising biasing voltages V0 may include a minimum biasing voltage corresponding to a maximum voltage allowed for the cell state having the lowest resistance value, a maximum biasing voltage corresponding to a maximum sensing voltage and N−2 gradual voltage steps between the minimum biasing voltage and the maximum biasing voltage.

The prebiasing operation may be explained as follows: Controller 105 may apply a first biasing voltage V0 through voltage regulator 231. After a certain small number of clock cycles of prebiasing, controller 105 may check the prebiasing voltage using voltage comparator 234 to determine whether current I1 flowing through the resistive memory cell 202 and the resistor 250 is higher or lower than second current I2. If first current I1 is higher than second current I2, the prebiasing may be over and controller 105 may disconnect the voltage regulator 231 from node 261. Accordingly, the final settling over bitline BL as depicted in FIG. 3A may occur. On the other side, if controller determines that the current I1 is lower than the second current I2, the next biasing voltage V0, controller 105 may apply the above steps and repeat the prebiasing comparison.

After controller 105 applies the (N−1)-th biasing voltage steps and the current I1 through the resistive memory cell 202 and the resistor 250 is still lower than the second current I2, controller 105 may apply the final prebiasing voltage. Controller 105 may then apply the final settling over the bitline BL as depicted in FIG. 3A.

Figure 4:
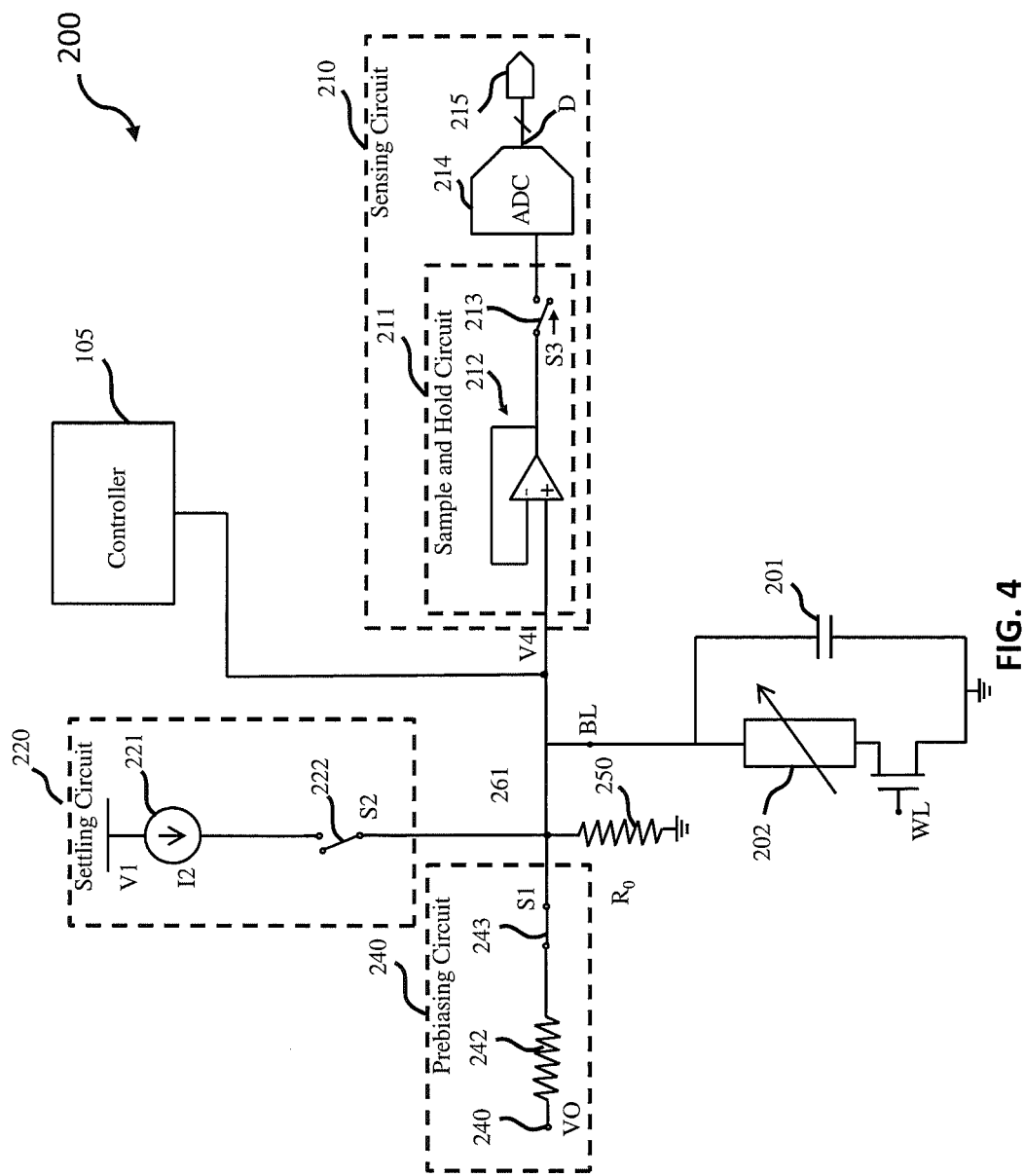
FIG. 4 is a circuit diagram for a device for determining an actual cell state of a resistive memory cell in a prebiasing mode in accordance with some exemplary embodiments.

Referring now to FIG. 4, a circuit diagram for a device 200 is depicted, in accordance with some exemplary embodiments. Device 200 may be configured for determining an actual cell state of a resistive memory cell 202 in a prebiasing mode. The embodiment depicted in FIG. 4 may differ from the first embodiments depicted in FIGS. 2 and 3 with respect to the arrangement of prebiasing circuit 240. Prebiasing circuit 240 of FIG. 4 may include a serial connection of a voltage source 241 for providing the prebiasing voltage V0, a resistor 242 and a switch 243 for connecting and disconnecting the prebiasing circuit 240 to the first node 261. In particular, the resistor 242 of the prebiasing circuit 240 may have equal or lower resistance to the resistor 250 coupled in parallel to the resistive memory cell 202 and the resistor 242.

Figure 5:
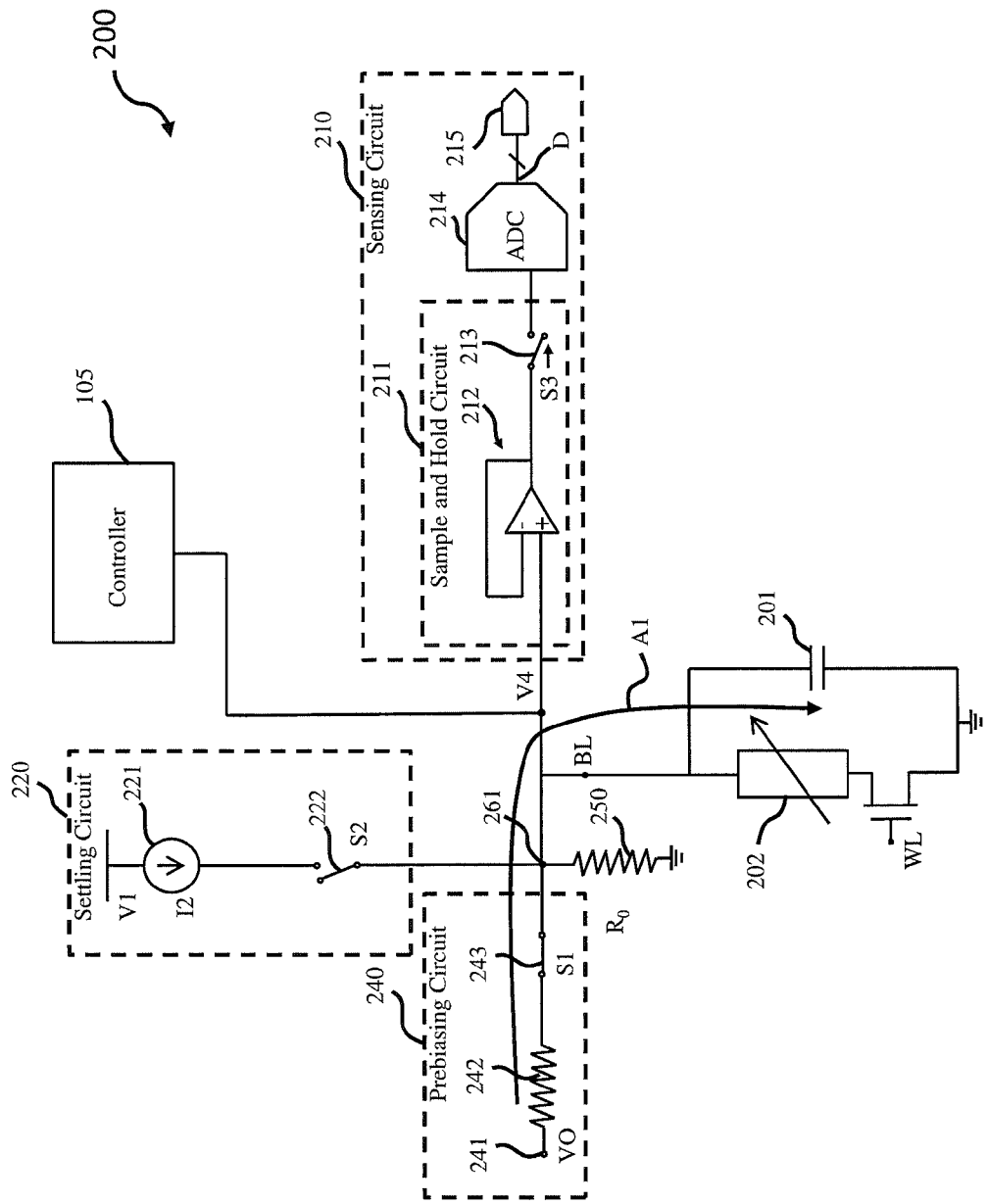
FIG. 5 is a circuit diagram for the device of FIG. 4 in the prebiasing mode in accordance with some exemplary embodiments.
Figure 6:
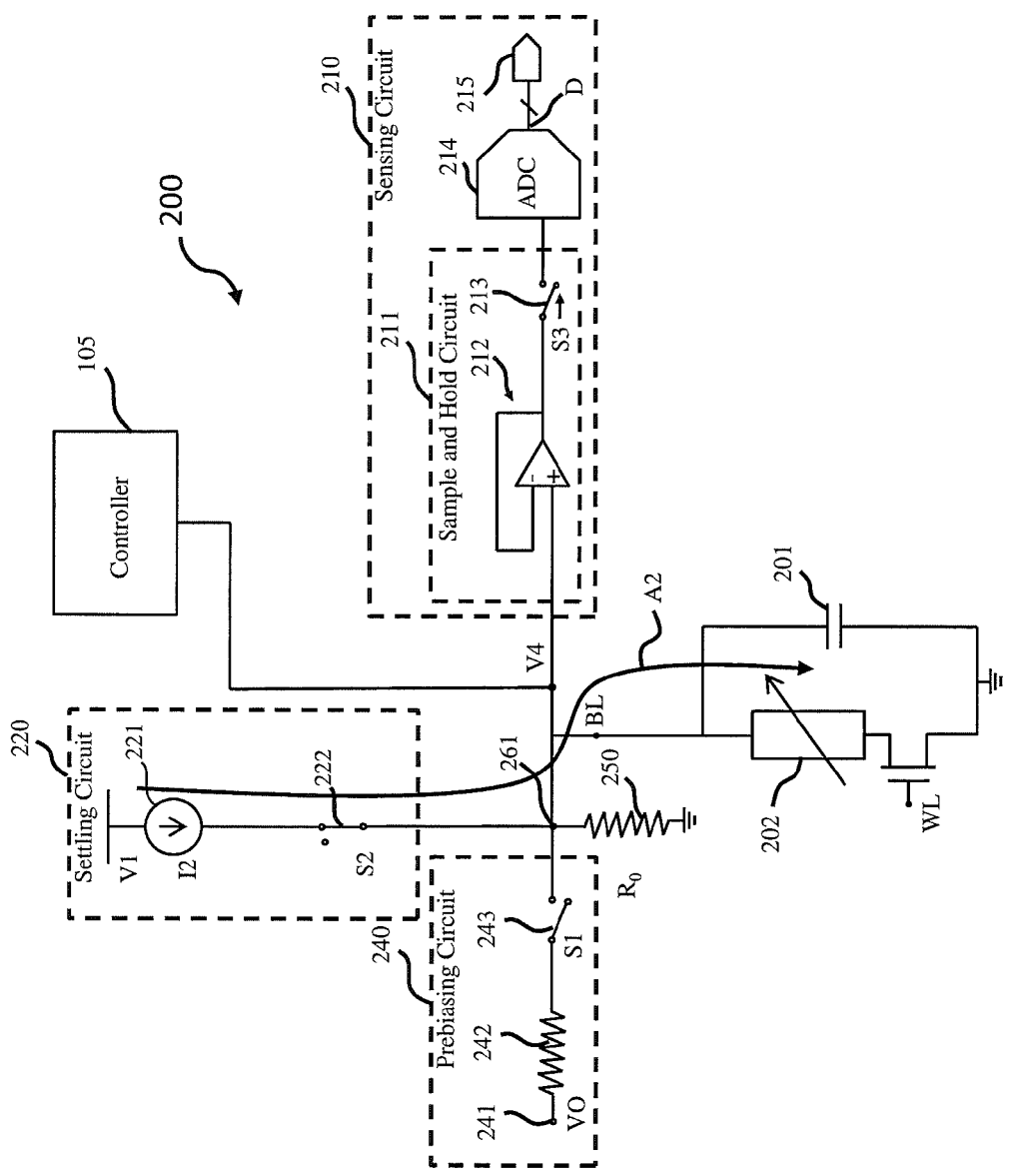
FIG. 6 is a circuit diagram for the device of FIG. 4 in a settling mode in accordance with some exemplary embodiments.
Figure 7:
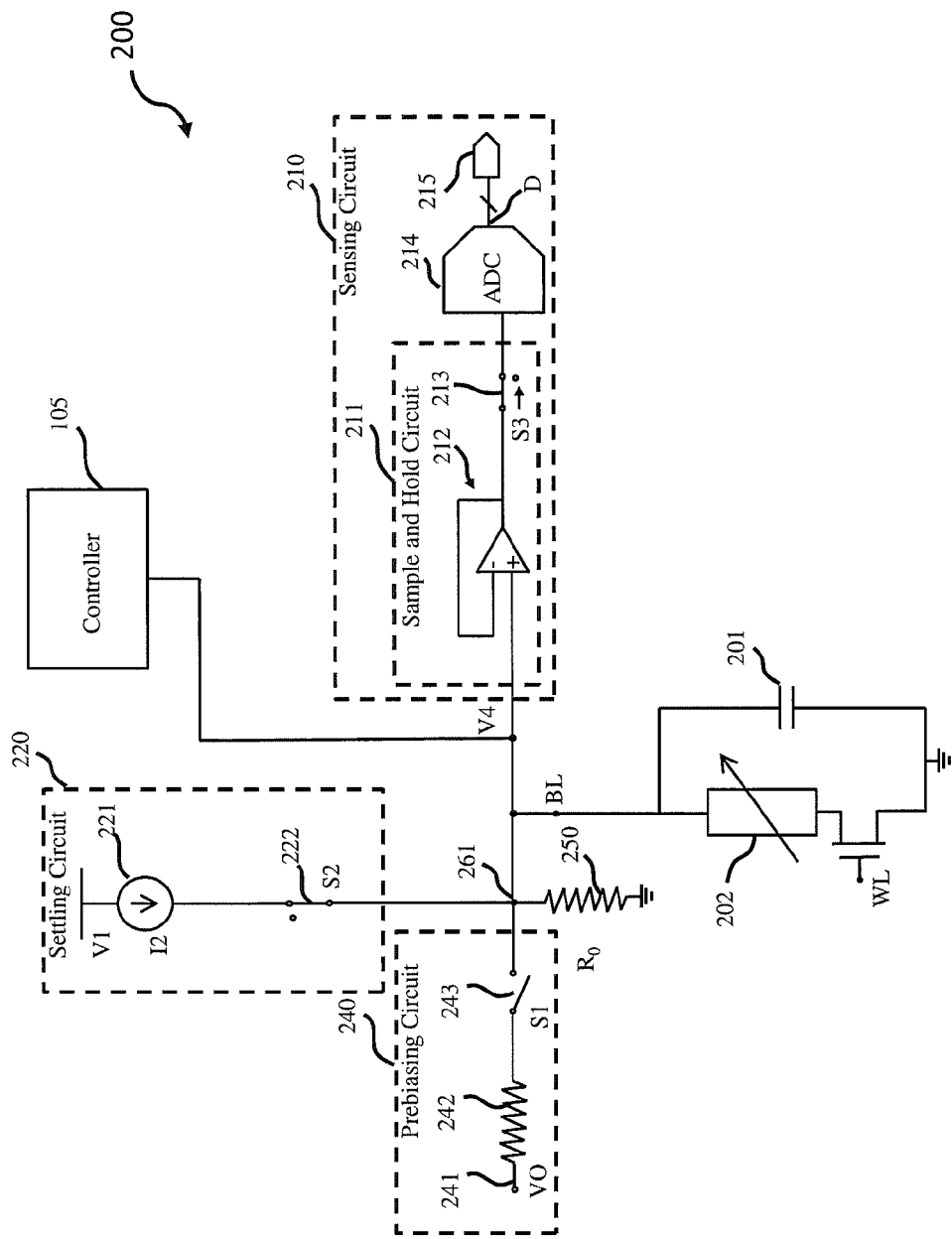
FIG. 7 is a circuit diagram the device of FIG. 4 in a sampling mode in accordance with some exemplary embodiments.

FIGS. 5-7 depict device 200 in different operating modes. Considering now FIG. 5, device 200 is depicted in the prebiasing mode, according to some exemplary embodiments. In some aspects, in the prebiasing mode, controller 105 may open switch 222, close switch 243, and open switch 213. In some aspects, as depicted in FIG. 5, current may flow from the voltage source V0 via node 261 to bitline BL and therefore to the resistive memory cell 202. The current flow in FIG. 5 is shown by arrow A1.

Further, according to some embodiments, in the settling mode as depicted in FIG. 6, device 200 may open switch 243, close switch 222, and open switch 213. As a result, system 200 may direct the current to flow from the current mirror 221 to the resistive memory cell 202 over the first node 261 and the bitline BL. The current flow in FIG. 6 is shown by arrow A2.

FIG. 7 depicts a circuit diagram device 200 in a sampling mode, in accordance with some exemplary embodiments. Referring now to FIG. 7, device 200 may open switch 243, close switch 222, and close switch 213. Controller 105 may control the sampling by the third control signal S3 applied to switch 213.

Figure 8:
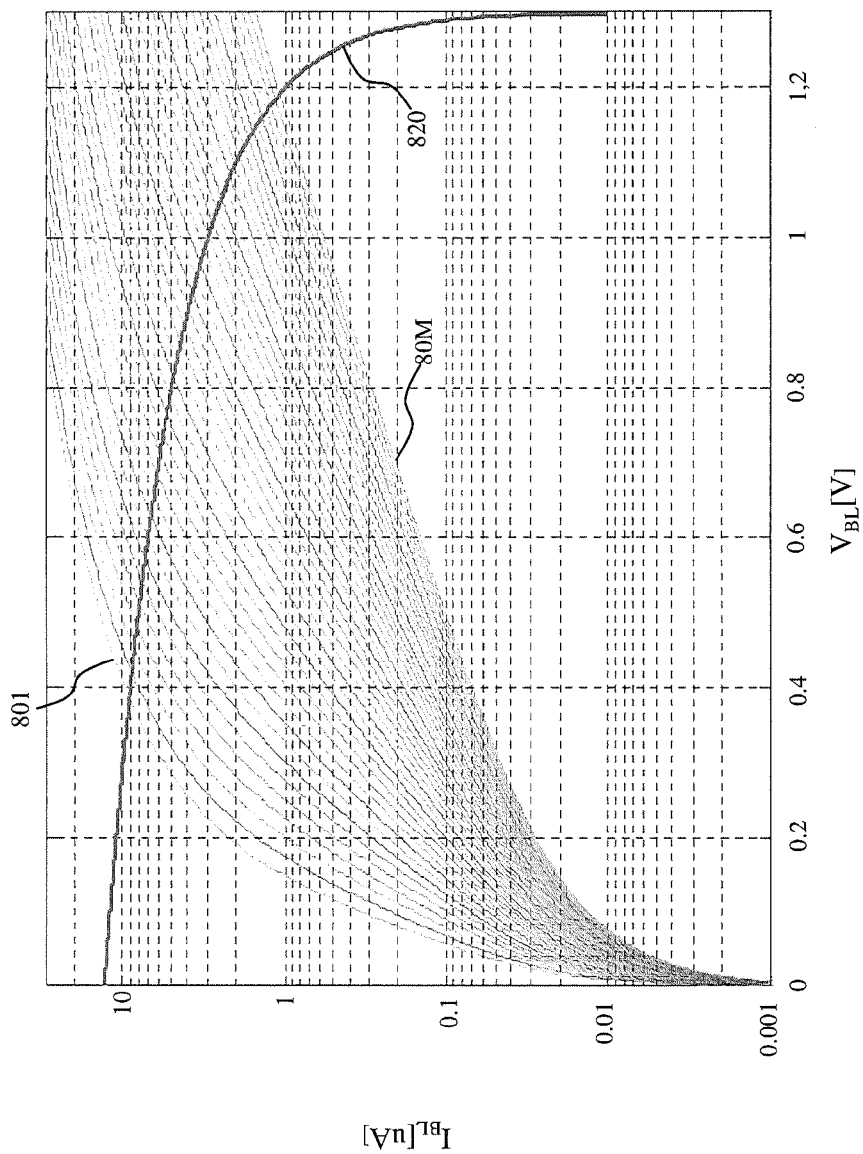
FIG. 8 depicts a graph of I-V characteristics of the cell states of a PCM cell and a detection curve for reading the cell states in accordance with some exemplary embodiments.

FIG. 8 depicts a graph of the I-V characteristics of the cell states of a PCM cell and a detection curve for reading the cell states, in accordance with some exemplary embodiments. The different cell states of the PCM cell (e.g., resistive memory cell 202) are shown by curves 801-80M. The curve 811 shows the cell state with the lowest resistance value of the PCM cell, wherein curve 80M shows the cell state having the highest resistance value. Further, FIG. 8 depicts detection curve 820 configured for reading cell states 801-80M of the PCM cell.

The detection curve 820 may be a function of the resistance value R0 of resistor 250, the function providing $$I3=I2-V4/R0,$$

where V4 is a sensing voltage and I3 is the current flowing through resistive memory cell 202 only. Thus, the detection curve 820 may be derived by R0 with the effect of minimizing the settling time.

Figure 9:
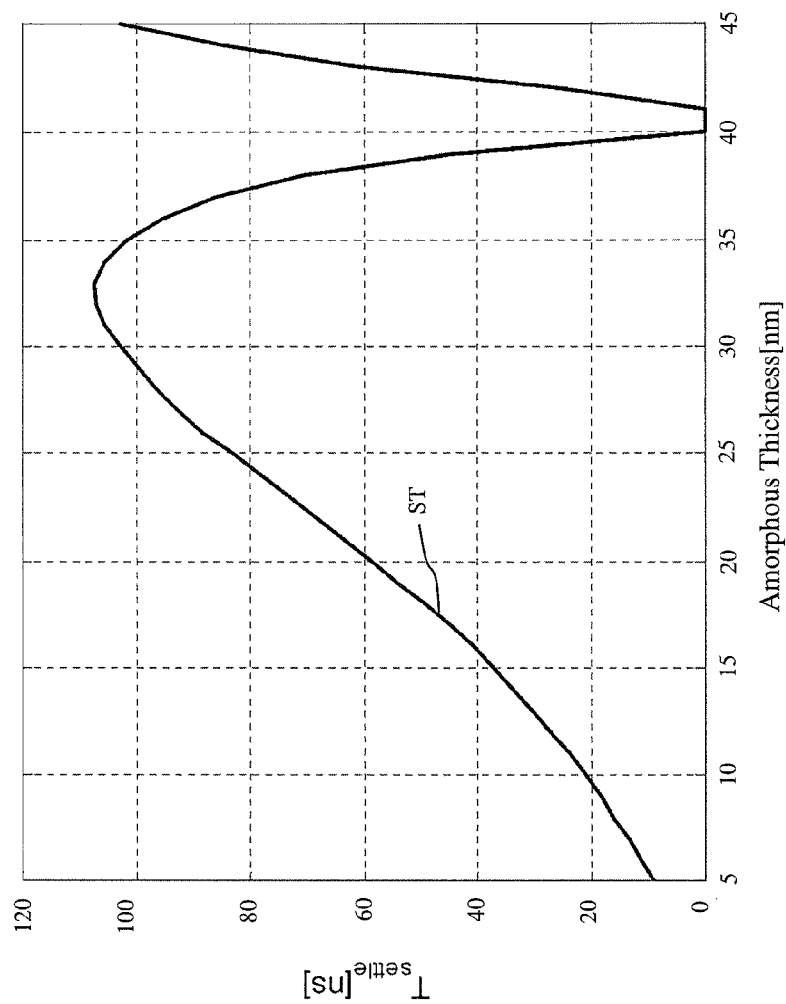
FIG. 9 depicts a graph illustrating the settling time in accordance with some exemplary embodiments.

FIG. 9 depicts a graph illustrating the settling time ST in order to get 0.5 LSB accuracy, in accordance with some exemplary embodiments. FIG. 9 shows that the minimum of the settling time ST may be near the highest resistance voltage of the cell corresponding to highest amorphous thickness.

Figure 10:
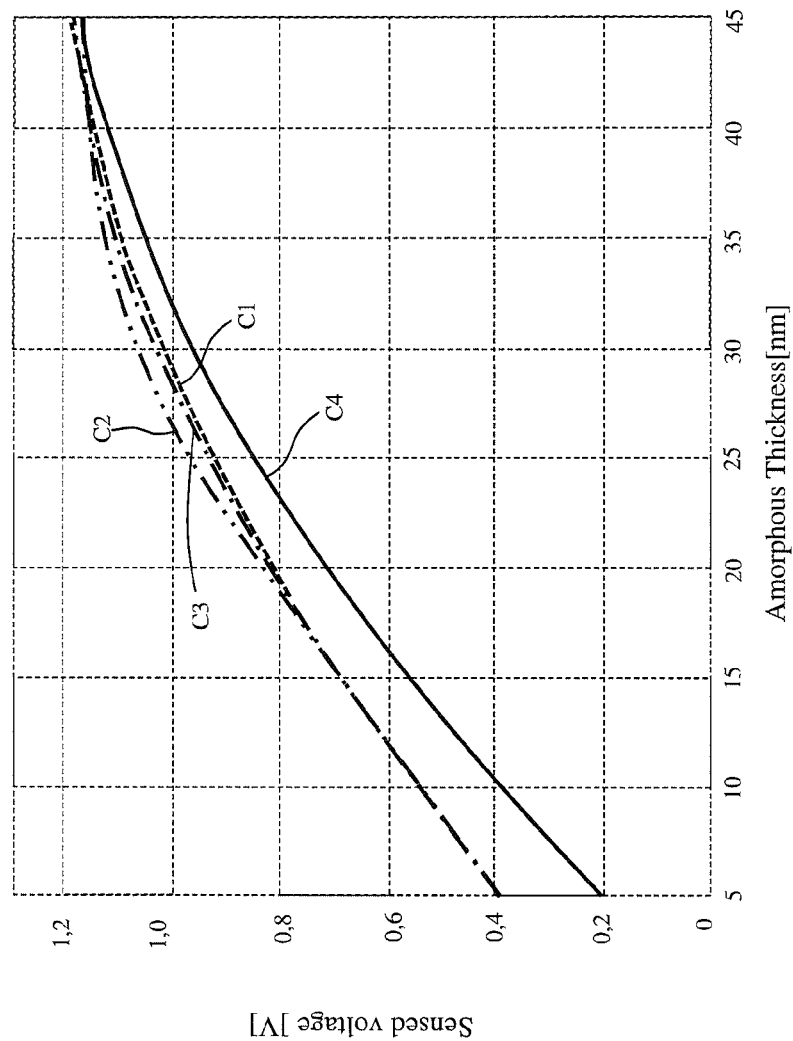
FIG. 10 depicts a graph illustrating the sensing voltages for different settling times in accordance with some exemplary embodiments.

FIG. 10 depicts a graph illustrating the sensing voltages V4 for different settling times, in accordance with some exemplary embodiments. Referring now to FIG. 10, curve C1 depicts the sensing voltage V4 after infinite settling time, which may be equal to a certain target voltage. Curve C2 shows the sensing voltage V4 with a settling time of 50 ns, curve C3 shows the sensing voltage V4 with a settling time of 200 ns and curve C4 shows the voltage at the PCM cell. In the light of FIG. 10, it is appreciated that may not be necessary to wait for the full settling time (e.g. 200 ns) for 0.5 LSB accuracy. For a shorter settling time of 50 ns, only the detection curve shape may change in a favorable way with respect to noise suppression having higher sensing current for intermediate values.

For example, the total latency time using the present realization may be 202 ns in sum:

90 ns for the prebiasing steps;
50 ns settling time; and
60 ns for the analog-to-digital conversion.

Figure 11:
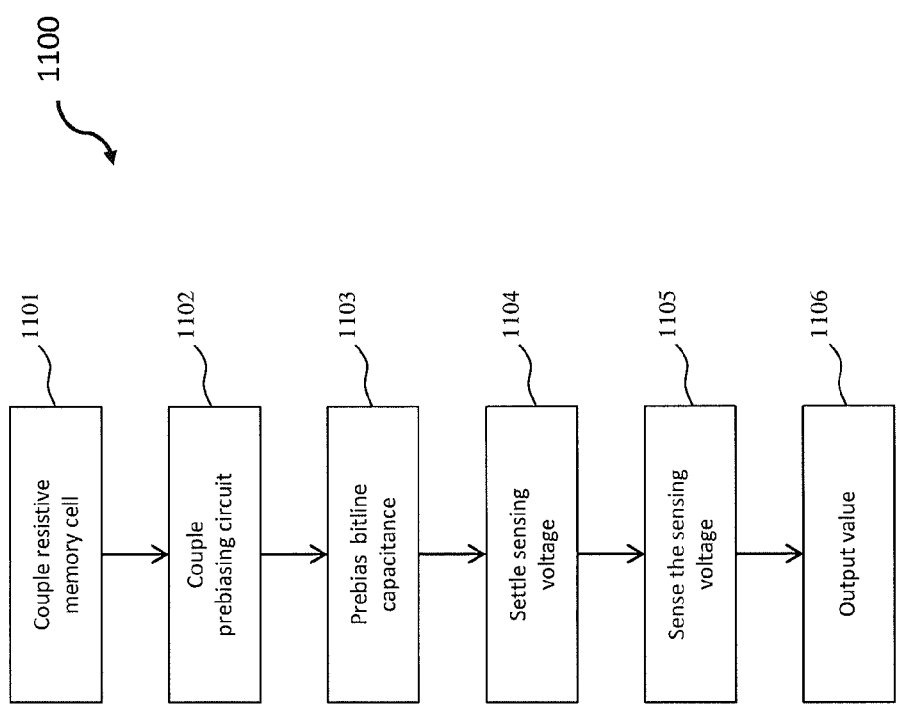
FIG. 11 is a flow diagram of a method for determining an actual cell state of a resistive memory cell having a plurality of programmable cell states.

FIG. 11 depicts a method 1100 for determining an actual cell state of a resistive memory cell having a plurality M of programmable cell states, in accordance with some exemplary embodiments. Referring now to FIG. 11, as shown in block 1101, controller 205 may couple a resistor in parallel to the resistive memory cell such that the resistor is configured to reduce an effective resistance seen by the prebiasing circuit. As represented in block 1102, controller 205 may couple a prebiasing circuit to the resistive memory cell. In some aspects, controller 105 may prebias a bitline capacitance of the resistive memory cell by the prebiasing circuit such that a sensing voltage of the resistive memory cell may be close to a certain target voltage which is indicative for the actual cell state, as shown in block 1103. With respect to block 1104, controller 205 may settle the sensing voltage to the certain target voltage. In some embodiments, controller 105 may sense the voltage of the resistive memory cell 205 by a sensing circuit (e.g., sensing circuit 210), as shown in block 1105. Finally, controller 105 may output a result responsive to the sensing voltage, as shown in block 1106.

In some embodiments, resistive memory 102 may be subject to wide range of operating temperatures. As explained above, PCM cell state is strongly correlated to (that is, may be affected by) the operating temperature of the resistive memory device. This effect on cell state may affect the accuracy and/or dependability of the value stored in the PCM cell even more than effects due to resistance drift that may vary from the beginning of the retention window to the end of the retention window. In addition, each cell state may have different sensitivity to the temperature effective yielding temperature compensation during readout difficult.

Therefore, it may be advantageous to provide systems and methods to dynamically adjust readout parameters of device 200 to compensate for temperature changes. In some aspects, dynamic adjustment of the parameters affecting readout accuracy may provide consistent and accurate readout metric values at the end of the retention window without being materially affected by operating temperature variations.

In some aspects, a plurality of elements including additional series resistors, additional biasing currents and switches may be dynamically actuated by the controller. According to some embodiments, the controller may determine a current operational temperature at one chip or a plurality of PCM memory banks, access information indicative of parameters associated with each cell, chip, and/or PCM memory bank, etc., and actuate one or more of a plurality of settling circuits based on the discovered (observed and known) temperature and operational parameters of the respective memory. In some aspects, the system may be configured to provide linear detection curves tuned to each particular memory bank at every operating temperature within a given range of operational temperatures.

In some embodiments, readout metrics may include two independent read parameters—biasing current and parallel resistance. With those two independent parameters a whole family of detection curves may be possible, which may better match the read cell state values at each of the various operational temperatures compared to any readout method based only on a single independent read parameter. By combining uniquely defined biasing currents and resistors detection curves, the resultant outputs sensed by the controller may be consistent without affect by temperature fluctuations.

Figure 12:
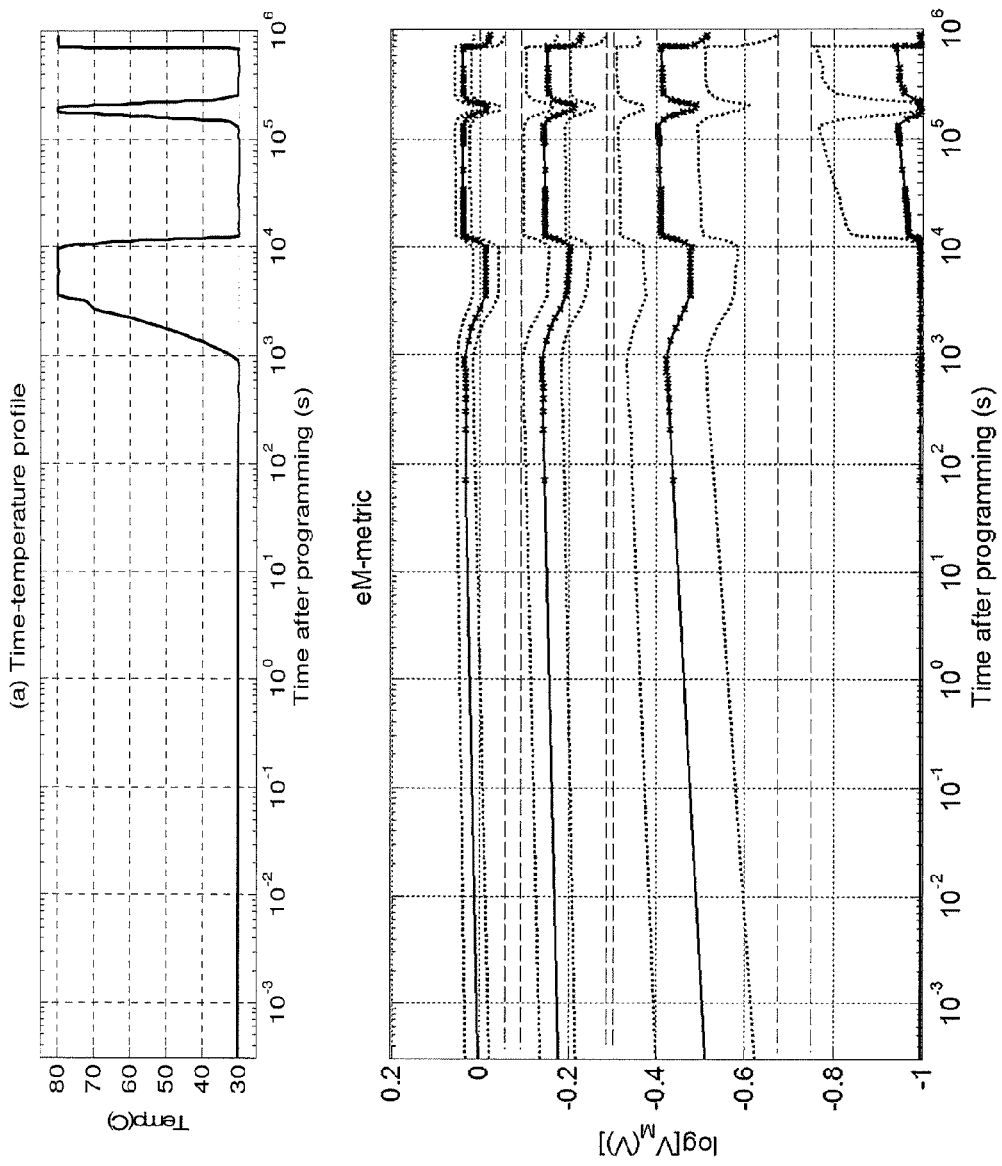
FIG. 12 depicts two graphs of an evolution of cell-state voltage levels with time-temperature profiles in accordance with some embodiments.

Referring now to FIG. 12, two graphs are depicted showing an evolution of cell-state voltage levels with time-temperature profiles. The top graph depicts temperature with respect to time over the course of an exemplary retention window. For example, an exemplary retention window may be roughly 1,000,000 seconds, or about 9 days. Over the course of the retention window, temperature can be varied from a nominal room temperature (e.g., 30° C.) to a maximum operational temperature (e.g., 80° C.). Referring now to the bottom most graph, a logarithmic representation of cell-state voltage $V_M$ is depicted with respect to the same time period. Voltage levels observed from an exemplary resistive memory cell are shown to have an inverse relationship with respect to temperature in that voltage drops (resistance decreases) when temperature is increased. In some aspects, it may be advantageous to provide systems, methods, and devices that provide consistent (materially flat) voltage readings over the course of the retention window when temperature is varied.

Figure 13:
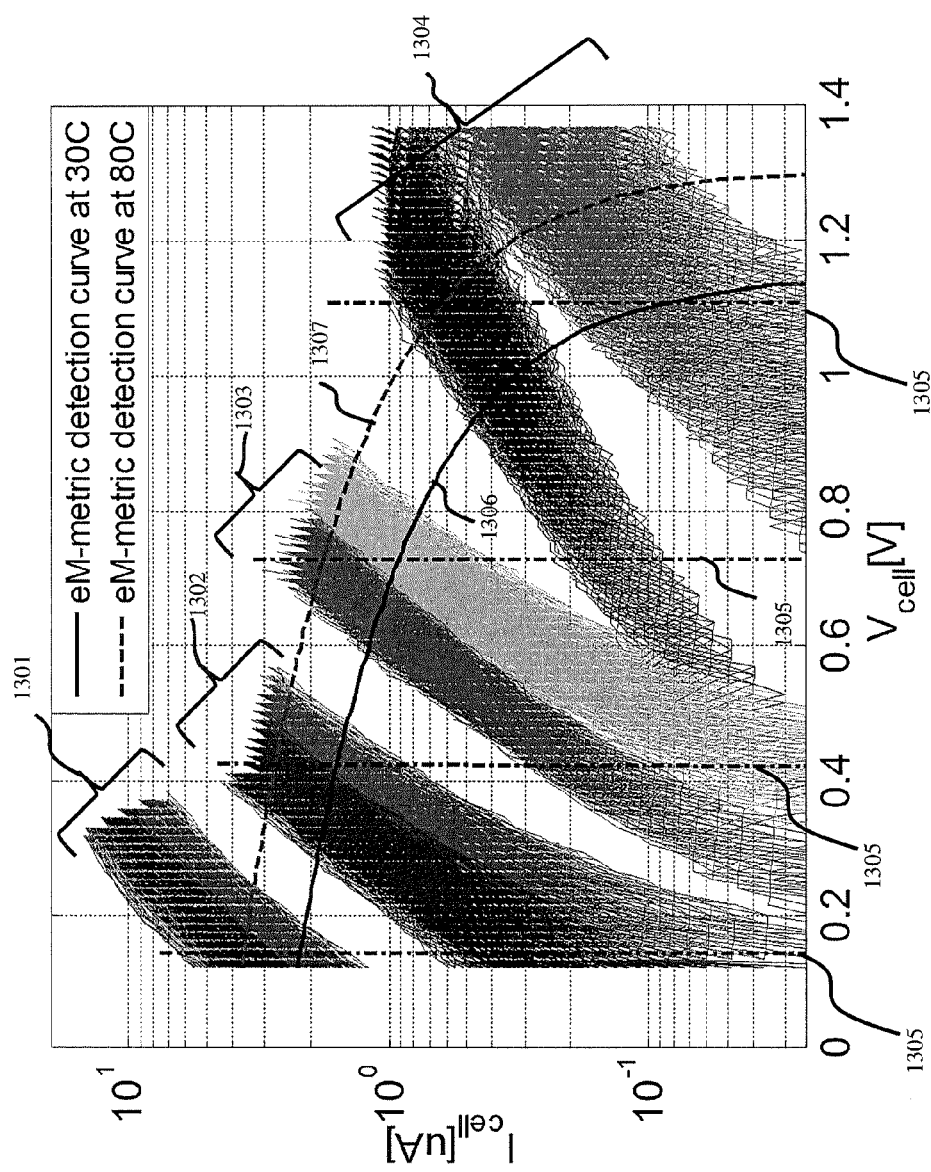
FIG. 13 depicts a graph of I-V characteristics of the cell states of a PCM cell and a set of detection curves for reading the cell states at two operational temperatures in accordance with some embodiments.

Referring now to FIG. 13, a graph of the I/V characteristics of the cell states of a PCM cell and a detection curve for reading the cell states, at two operational temperatures is depicted, in accordance with some embodiments. The graph of FIG. 13 shows four discrete levels (m-levels) 1301, 1303, 1303, and 1304. The curve 1301 shows the cell state with the lowest resistance value of the PCM cell, wherein curve 1304 shows the cell state having the highest resistance value. Further, FIG. 13 depicts optimal detection curves 1306 and 1307 configured for reading cell states 1301-1304 of the PCM cell. Each level depicts bands of resistance readings of multiple cells at two operational temperatures 30° C., shown as the lighter level bands, and 80° C. represented as the darker level bands. Vertical lines 1305 are mean values of the sensed voltages at each level that is read at 30° C. based on detection curve 1306. The crossing points define the mean current at each respective temperature. As shown in the graph of FIG. 13, current can vary for each temperature of the mean m-(I, V) pairs. For each higher temperature, there may be a procedure to get the optimal detection curve.

Optimal voltage measurements may have a minimized mean square error between an enhanced voltage-metric value at each resistance level, regardless of the temperature (within an expected range of operational temperatures). According to some embodiments, it may be advantageous to provide systems and methods for optimizing the voltage-based measurements by minimizing the mean square error between the mean enhanced voltage-metric value of each level at room temperature (e.g., 30° C.) and at an elevated temperature (e.g., 80° C.).

Figure 14:
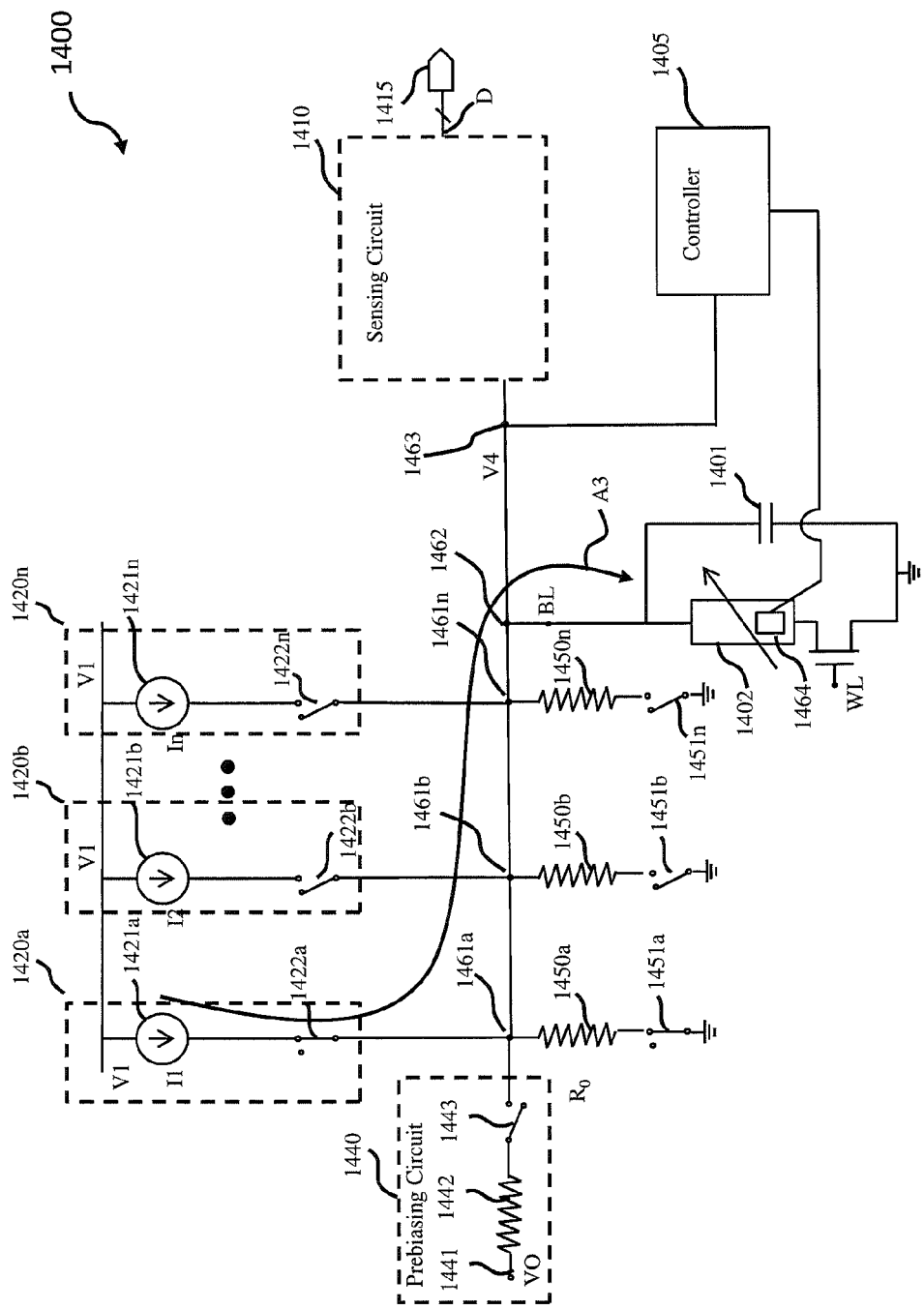
FIG. 14 is a circuit diagram of a device for optimizing voltage-based measurement of a resistive memory cell having a plurality m of programmable cell states in accordance with some exemplary embodiments.

FIG. 14 is a circuit diagram of a device 1400 for optimizing a voltage-based measurement of a resistive memory cell having a plurality m of programmable cell states in accordance with some exemplary embodiments. Referring now to FIG. 14, device 1400 may include a sensing circuit 1410, a plurality of settling circuits 1420a-1420n, a prebiasing circuit 1430 and resistors 1450a-1450n. In comparison to device 200, device 1400 may include the plurality of resistors 1450a, 1450b . . . 1450n. Resistors 1450a-1450n can be coupled in parallel to the resistive memory cell 1402 (also referred to hereafter as "PCM cell 1402"). Resistive memory cell 1402 may be a PCM cell having a plurality M of programmable cell states. Controller 1405 may actuate a respective one of resistors 1450a-1450n via a combination of switches 1422a-1422n, and switches 1451a-1451n.

Sensing circuit 1410 may be configured to sense a sensing voltage V4 of the resistive memory cell 1402 and output a resultant value D (e.g. a digital value D) in response to the sensing voltage V4. The sensing voltage V4 and therefore also the resultant value D may be indicative of the actual cell state of resistive memory cell 1402. Sensing circuit 1410 may include features comparable and similar to sensing circuit 210.

Settling circuit 1420 can be configured to settle the sensing voltage V4 to a certain target voltage representing one of the M programmable cell states. Controller 1405 may couple a corresponding one of settling circuits 1420a-1420n to a supply voltage V1 and may include a current mirror 1421.

Prebiasing circuit 1430 may be coupled between current mirror 1421a and a first node 1461a connecting prebiasing circuit 1440 to sensing circuit 1410. Current mirrors 1420b-1420n may be similarly configured with respect to nodes 1461b-1461n. Resistors 1450a-1450n may be coupled in parallel to resistive memory cell 1402 and therefore also be connected to nodes 1461a-1461n. The resistive memory cell 1402 can include a bitline BL, a bitline capacitance 1401 and a wordline WL. Bitline BL of PCM cell 1402 may be connected to any one or more of nodes 1461a-1461n, 1462, and/or 1463.

According to some embodiments, the resistance of resistor 1450 may be at least 5 times smaller than a highest resistance value of the resistive memory cell 1402. For example, the resistance of resistors 1450a-1450n may respectively be between 5 and 15 times smaller than a highest resistance value of the resistive memory cell 1402.

Concerning the prebiasing circuit 1440, the embodiment depicted in FIG. 14 may also differ from the first embodiments depicted in FIGS. 2 and 3 with respect to the arrangement of prebiasing circuit 1440. Prebiasing circuit 1440 may include a serial connection of a voltage source 1441 for providing the prebiasing voltage V0, a resistor 1442 and a switch 1443 for connecting and disconnecting the prebiasing circuit 1440 to node 1461. In particular, the resistor 1442 of the prebiasing circuit 1440 may have equal or lower resistance to the resistors 1450a-1450n coupled in parallel to the resistive memory cell 1402 and the resistor 1442.

Device 1400 may further include a controller 1405 for controlling the switches 1422a-1422n, 1443 and 1451a-1451n. Device 1400 may be coupled to controller 105 as shown in FIG. 1. In other embodiments, controller 1405 may be configured to control the number of switches 1422a-1422n, 1443 and 1451a-1451n such that, in a prebiasing phase (or prebiasing mode), controller 1405 may connect prebiasing circuit 1440 to nodes 1461a-1461n, and in a settling phase (or settling mode), controller 1405 may connect a respective one of settling circuits 1420a-1420n to a corresponding one of nodes 1461a-1461n, and disconnect prebiasing circuit 1430 from nodes 1461a-1461n, 1462 and 1463.

Device 1400 may control switches 1422a-1422n, 1443 and 1451a-1451n responsive to sensing temperature via one or more temperature sensors 1464 that may be configured to sense an operational temperature at resistive memory cell 1402. For example, controller 1405 may sense a temperature at memory 1402, access information indicative of an optimal one of settling circuits 1420a-1420n for optimizing a voltage-based measurement at output D, and control switches 1422a-1422n, 1443 and 1451a-1451n to operatively connect a settling circuit based on the sensed temperature.

Figure 15:
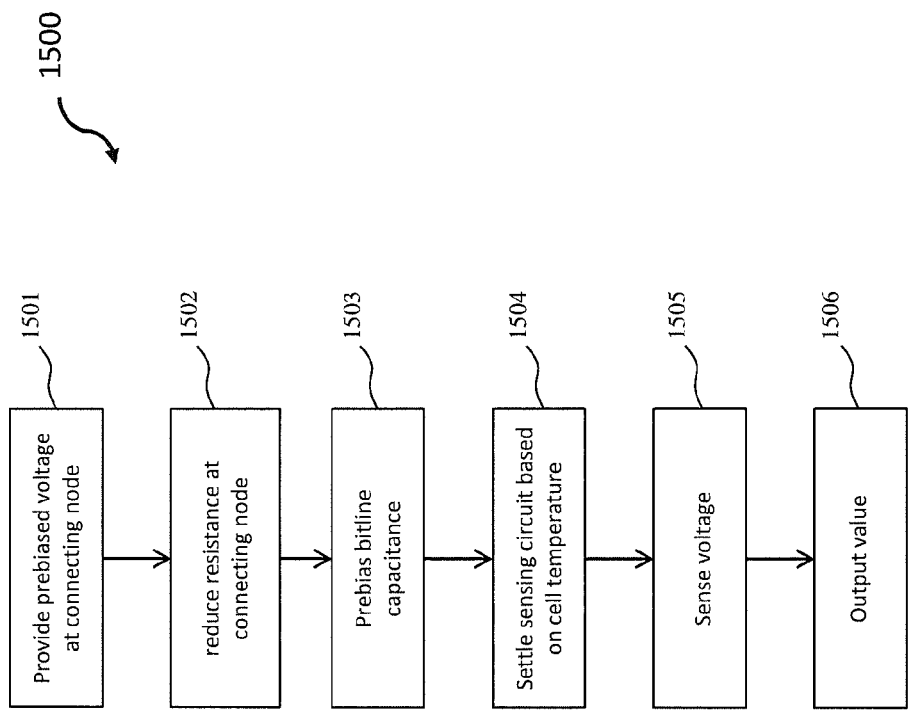
FIG. 15 is a flow diagram for a computer-implemented method for performing a voltage-based measurement of a resistive memory cell having a plurality m of programmable cell states in accordance with some exemplary embodiments.

FIG. 15 depicts a flow diagram for a computer-implemented method 1500 for optimizing a voltage-based measurement of a resistive memory cell having a plurality m of programmable cell states, in accordance with some exemplary embodiments. As shown at block 1501, controller 1405 may provide a prebiased voltage at a connecting node 1461a. According to some embodiments, controller 1405 may simultaneously provide the prebiased voltage at nodes 1461a-1461n.

As shown at block 1502, controller 1405 may reduce an effective resistance at the connecting node of the prebiasing circuit, which may simultaneously provide the prebiased voltage to all of nodes 1461a-1461n. In some aspects, controller 1405 may couple resistors 1450a-1450n in parallel to the resistive memory cell 1402 such that the effective resistance at the nodes is reduced.

As shown at block 1503, controller 1405 may prebias a bitline capacitance of resistive memory cell 1402 by prebiasing circuit 1440.

As shown at block 1504, in some aspects, controller 1405 may then settle the sensing circuit to a target voltage by connecting one of a plurality of settling circuits to the sensing circuit. Controller 1405 may determine the optimal settling circuit from the plurality of settling circuits (e.g., settling circuits 1420a-1420n) by observing a temperature at resistive memory 1402. For example, controller 1405 may settle a target voltage to sensing circuit 1410 by reading a temperature from temperature sensor 1464, accessing a lookup table (not shown) indicative of an activation value for each pair of switches (e.g., switches 1422a and 1451a are a pair) that select the optimal detection curve for the given sensor temperature. The temperature may be indicative of a temperature at each of the read heads on an entire memory chip, or may be indicative of a temperature at a plurality of chips organized as part of a plurality of chip banks.

Figure 18:
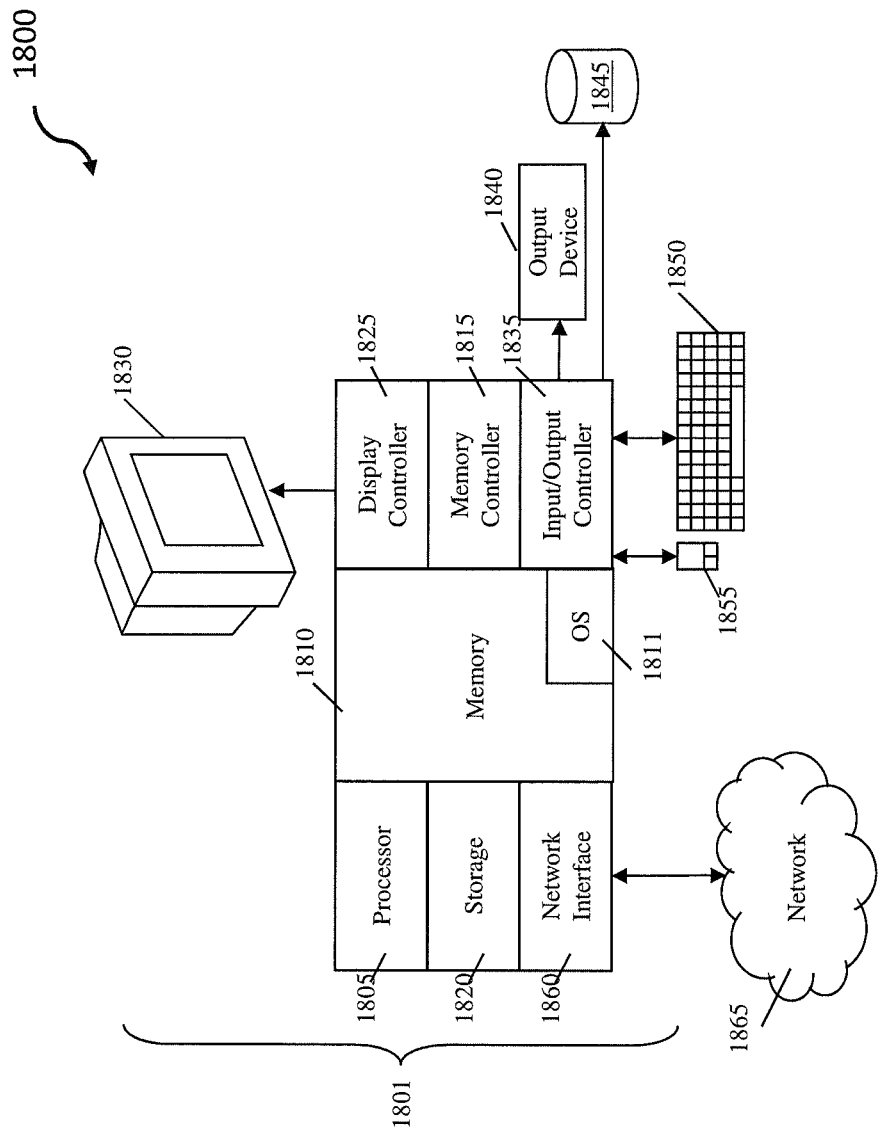
FIG. 18 shows a schematic block diagram of a system for determining an optimal detection curve in accordance with some exemplary embodiments.

In some aspects, the lookup table may be stored on an operatively connected computer-readable memory, such as, for example, memory device 1810 and/or storage device 1820 (as depicted in FIG. 18). The memory device may be part of controller 1405, or may be separate from controller 1405 but operatively connected. Each of the optimal detection curves switches configurations stored in memory as part of the lookup table may be based on a previously observed optimal detection curve that can provide a resultant voltage value D at sensing circuit 1410 being equal at all temperatures within a predetermined range of operational temperatures for each level.

As shown at block 1505, controller 1405 may sense a voltage of the resistive memory cell 1402. Controller 1405 may then output an enhanced voltage-metric value based on the sensed voltage, as shown at block 1506.

As described herein, controller 1405 may adjust voltage readout parameters to provide substantially constant voltage outputs regardless of the read temperature. Accordingly, controller 1405 may provide the same enhanced voltage-metric value read at the end of retention window, where the enhanced voltage metric value falls within a predetermined range of mean error, without being substantially affected by operational temperature.

Figure 16:
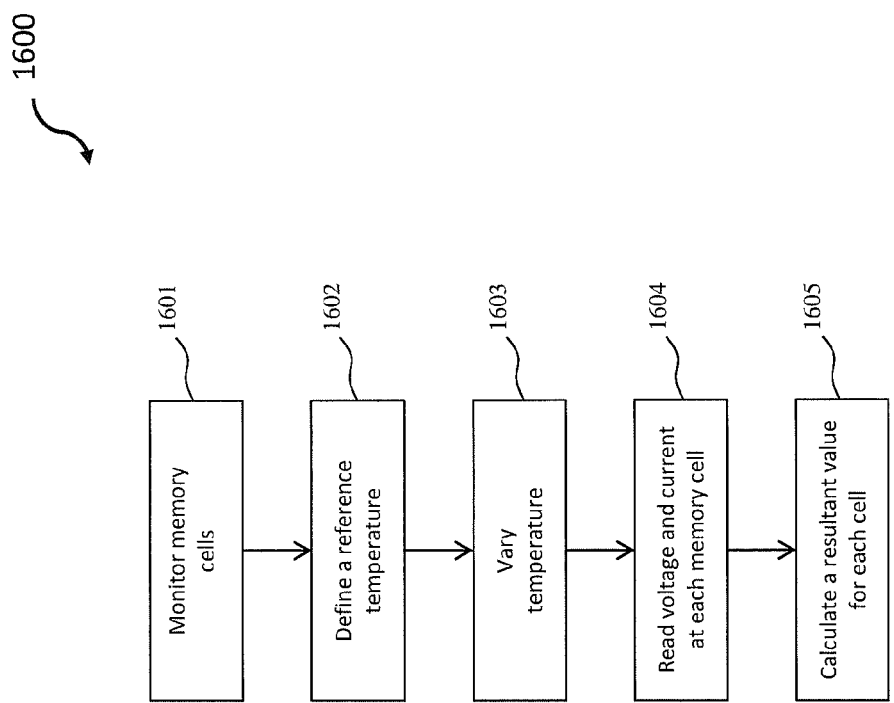
FIG. 16 is a flow diagram for a method for determining an optimal detection curve in accordance with some exemplary embodiments.

Referring now to FIG. 16, a flow diagram for a method 1600 for determining an optimal detection curve in accordance with some exemplary embodiments. Controller 1405 may select optimized parameters by referencing the lookup table. The lookup table may include optimization information for selecting an optimal detection curve. Referring now to FIG. 16, method 1600 exemplifies a method for determining an optimal curve.

As shown at block 1601, controller 1405 may monitor resistive memory cell 1402 at the end of a predetermined period of time described herein as a retention window. The retention window is generally a period of time ranging from minutes or hours to a period of several days and is part of a memory specification. As shown at block 1602 a reference temperature may be defined (e.g., 30° C., usually the minimum operating temperature of memory 1402). Accordingly a nominal detection curve for the reference temperature 1306 may be defined. A number of measurements may be performed at memory 1402 using a device 200 and enhanced voltage-metric values for a large collection of cells may be obtained. A mean enhanced voltage-metric value for each of the plurality of m levels 1305 ($V_{MEAN}$) may be calculated. Then at block 1603 temperature is varied from the reference temperature, a number of (I, $V_{MEAN}$) measurements are performed at memory 1402. As shown at block 1604, the (I, $V_{MEAN}$) values may be recorded for all m resistance levels with respect to the reference temperature. At each point of time (the end of the retention window) the temperature may be varied to certain discrete temperature levels (e.g., 30, 35 . . . 80° C., etc.), and values may be recorded for all expected operational temperatures for that memory cell. This may be performed for a large collection of the cells. As shown at block 1605, a resultant mean value of current for each of the plurality of m levels $I_{MEAN}$ may be calculated. Lastly, optimal detection curve 1307 may be determined for each respective discrete temperature level using ($I_{MEAN}$, $V_{MEAN}$) values of all m resistance levels by employing statistical approaches such as linear regression or mean square error minimization. Optimization goal is to minimize the mean square error between the mean enhanced voltage-metric value of each level at the reference temperature (e.g., 30° C.) and at an elevated temperature (e.g., 35, 40 . . . 80° C., etc.). Each of settling circuits 1420a-1420n may be optimized according to the information observed and recorded as part of the lookup table such that a particular circuit, when switched on, may provide an optimized detection curve with respect to a particular temperature.

Figure 17:
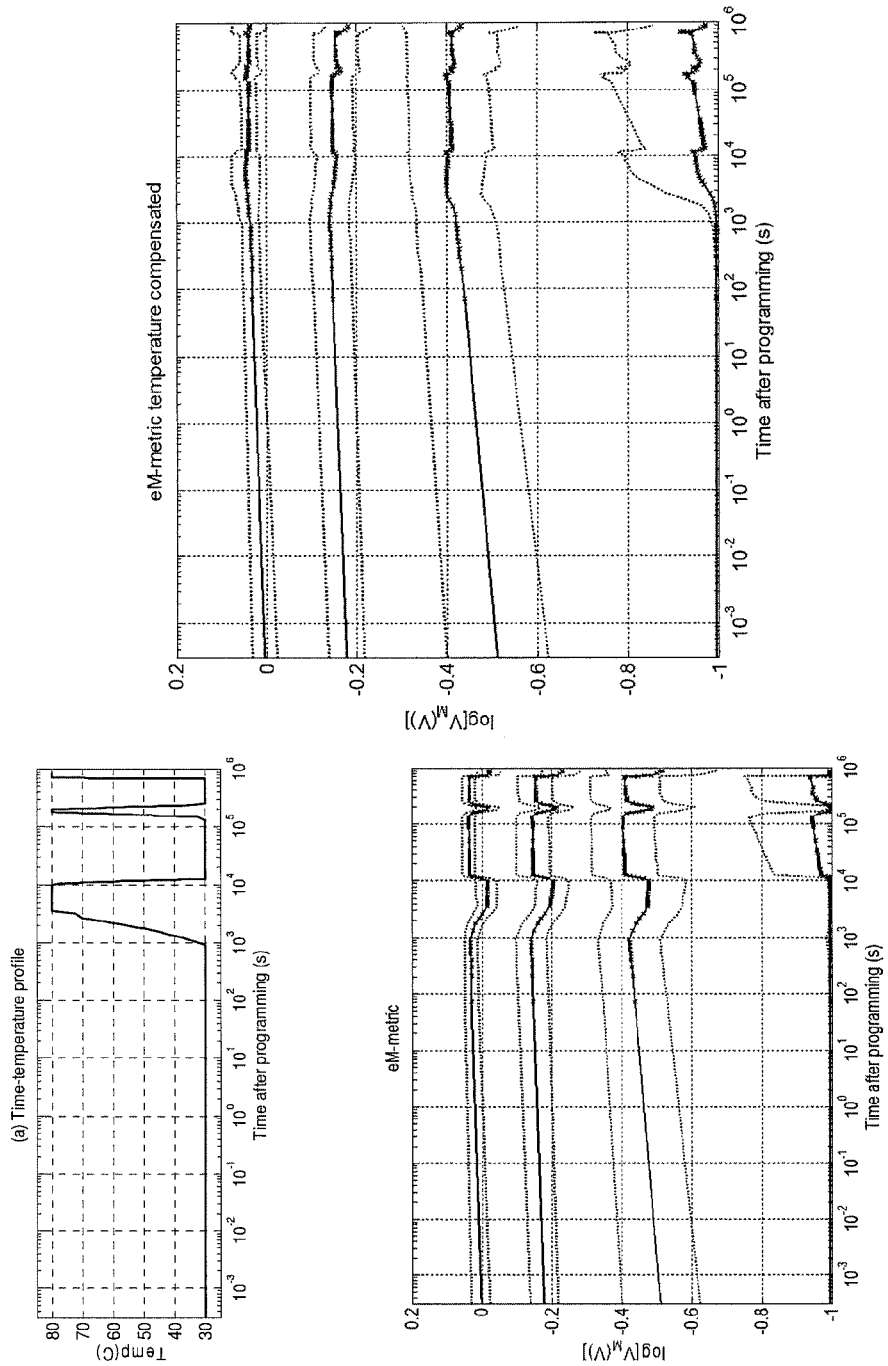
FIG. 17 shows a graph of performance of fixed threshold detection without and with temperature compensation, in accordance with some exemplary embodiments.

FIG. 17 shows graphs of performance of fixed threshold detection without and with temperature compensation, in accordance with some exemplary embodiments. After system 1400 employs optimized detection curve, the sensed values for each observed level are substantially even, as shown in FIG. 17. Optimization with multiple points may require optimizing the detection curves using multiple points. There will be a natural error in calculation with respect to actual observed voltage and current measurements. An optimized detection curve may have a minimized error in the mean value reading at each observed level. Although not perfectly straight, the detection curves may be optimized to be substantially straight.

Embodiments described herein may provide a benefit of temperature compensation that offsets any impact of temperature to the readout value. Some embodiments may improve the performance of not only fixed threshold detection but may also improve variable threshold performance due to increased gap between levels at the end of a retention window. In other aspects, another benefit may include simple circuit realization requiring only a small number of additional elements (transistors and resistors) in each read head, only one temperature sensor per chip or memory bank and a single look-up-table.

Computerized devices may be suitably designed for implementing embodiments of the present invention as described herein. In that respect, it is appreciated that the methods described herein are largely non-interactive and automated. In exemplary embodiments, the methods described herein may be implemented either in an interactive, partly-interactive or non-interactive system. The methods described herein may be implemented in software (e.g., firmware), hardware, or a combination thereof. In exemplary embodiments, the methods described herein are implemented in software, as an executable program, the latter executed by suitable digital processing devices. In further exemplary embodiments, at least one step or all steps of above methods of FIGS. 11, 15, and/or 16 may be implemented in software, as executable computer-readable instructions, the latter executed by suitable digital processing devices. More generally, some embodiments may be implemented wherein general-purpose digital computers, such as personal computers, workstations, etc., may be used.

For instance, the system 1800 depicted in FIG. 18 schematically represents a computerized unit 1801, which may be e.g., a general-purpose computer. In exemplary embodiments, in terms of hardware architecture, as shown in FIG. 18, the unit 1801 may include a processor 1805, memory 1810 coupled to a memory controller 1815, and one or more input and/or output (I/O) devices 1840, 1845, 1850, 1855 (or peripherals) that can be communicatively coupled via a local input/output controller 1835. Further, the input/output controller 1835 may be, but is not limited to, one or more buses or other wired or wireless connections, as is known in the art. Input/output controller 1835 may have additional elements, which are omitted for simplicity, such as controllers, buffers (caches), drivers, repeaters, and receivers, to enable communications. Further, the local interface may include address, control, and/or data connections to enable appropriate communications among the aforementioned components.

Processor 1805 may be a hardware device for executing computer-readable and executable instructions that may be stored in memory 1810. Processor 1805 may be any custom made or commercially available processor, a central processing unit (CPU), an auxiliary processor among several processors associated with the computer 1801, a semiconductor based microprocessor (in the form of a microchip or chip set), or generally any device for executing software instructions.

Memory 1810 may include any one or combination of volatile memory elements (e.g., random access memory) and nonvolatile memory elements. Moreover, the memory 1810 may incorporate electronic, magnetic, optical, and/or other types of storage media. Note that the memory 1810 may have a distributed architecture, where various components are situated remote from one another, but may be accessed by the processor 1805.

The computer-readable instructions in memory 1810 may include one or more separate programs, each of which comprising an ordered listing of executable instructions for implementing logical functions. In the example of FIG. 18, the instructions in memory 1810 may include methods described herein in accordance with exemplary embodiments and a suitable operating system (OS) 1811. OS 1811 may control the execution of other computer programs, such as the methods as described herein (e.g., FIG. 11), and may provide scheduling, input-output control, file and data management, memory management, and/or communication control and related services.

The methods described herein may be in the form of a source program, executable program (object code), script, or any other entity comprising a set of computer-readable and executable instructions to be performed. When in a source program form, then the program may be translated via a compiler, assembler, interpreter, and/or the like, as known per se, which may or may not be included within the memory 1810, so as to operate properly in connection with the OS 1811. Furthermore, the methods may be written as an object oriented programming language having classes of data and methods, or a procedure programming language, which may include routines, subroutines, and/or functions.

Possibly, a conventional keyboard 1850 and mouse 1855 may be coupled to the input/output controller 1835. Other I/O devices 1840-1855 may include sensors (especially in the case of network elements), e.g., hardware devices that produce a measurable response to a change in a physical condition like temperature or pressure (physical data to be monitored). Typically, the analog signal produced by the sensors may be digitized by an analog-to-digital converter and sent to controllers 1835 for further processing. Sensor nodes may consume low energy, are autonomous and operate unattended.

In addition, I/O devices 1840-1855 may further include devices that communicate both inputs and outputs. The system 1800 may further include a display controller 1825 coupled to a display 1830. In exemplary embodiments, the system 1800 may further include a network interface or transceiver 1860 for coupling to a network 1865.

The network 1865 may transmits and receives data between the unit 1801 and external systems. Network 1865 may be implemented in a wireless fashion, e.g., using wireless protocols and technologies, such as WiFi, WiMax, etc. The network 1865 may be a fixed wireless network, a wireless local area network (LAN), a wireless wide area network (WAN) a personal area network (PAN), a virtual private network (VPN), intranet or other suitable network system and includes equipment for receiving and transmitting signals.

The network 1865 may also be an IP-based network for communication between the unit 1801 and any external server, client and the like via a broadband connection. In exemplary embodiments, network 1865 may be a managed IP network administered by a service provider. Network 1865 may be a packet-switched network such as a LAN, WAN, Internet network, etc.

If unit 1801 is a PC, workstation, intelligent device or the like, the software in the memory 1810 may further include a basic input output system (BIOS). The BIOS is stored in ROM so that the BIOS may be executed when the computer 1801 is activated.

When the unit 1801 is in operation, the processor 1805 can be configured to execute computer-readable instructions stored within the memory 1810, to communicate data to and from the memory 1810, and to generally control operations of the computer 1801 pursuant to the instructions. The methods described herein and OS 1811, in whole or in part may be read by the processor 1805, typically buffered within the processor 1805, and then executed. When the methods described herein (e.g. with reference to FIG. 11) are implemented in software, the methods may be stored on any computer readable medium, such as storage 1820, for use by or in connection with any computer related system or method.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and non-transitory computer-readable media storing computer-executable instructions according to some exemplary embodiments. It will be understood that each block of the flowchart illustrations and/or block diagrams, and combinations of blocks in the flowchart illustrations and/or block diagrams, can be implemented by the computer-readable program instructions.

These computer-readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer-readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A computer-implemented method for performing a voltage-based measurement of a resistive memory cell having a plurality of programmable cell states, the method comprising:
   providing, via a processor, a prebiased voltage at a connecting node coupled to a the resistive memory cell;
   prebiasing a bitline capacitance of the resistive memory cell;
   settling, via the processor, a sensing circuit to a target voltage; and
   outputting a resultant value based on a sensed voltage at the resistive memory cell.

2. The computer-implemented method of claim 1, wherein settling the sensing circuit comprises reading a temperature sensor to determine the temperature reading.

3. The computer-implemented method of claim 2, wherein the temperature sensor is configured to read a temperature a plurality of memory cells organized as a memory storage bank.

4. The computer-implemented method of claim 2, wherein the temperature sensor is configured to read a temperature at a plurality of memory storage banks.

5. The computer-implemented method of claim 1, wherein the resultant value is constant at all temperatures within a predetermined range of operational temperatures of the resistive memory cell.

6. The computer-implemented method of claim 5, wherein a constant resultant value is within a predefined range of error.

7. The computer-implemented method of claim 1, wherein the sensed voltage is output based on an optimal detection curve.

8. The computer-implemented method of claim 7, wherein the optimal detection curve is determined by:
   monitoring the plurality of memory cells at the end of a predetermined time period;
   defining a reference temperature nominal detection curve and a mean enhanced voltage-metric value for each of the plurality of m levels;
   varying a temperature at each of the plurality of memory cells to a predetermined temperature, wherein the temperature is predetermined with respect to the reference temperature;
   reading a current at an output of each of the plurality of memory cells at a mean enhanced voltage-metric value for each of the plurality of m levels; and
   calculating the resultant mean value of current for each of the plurality of m levels at the end of the predetermined time period.

9. The computer-implemented method of claim 8, further comprising:
   reading the current at the output of each of the plurality of memory cells at a mean enhanced voltage-metric value for each of the plurality of m levels at a plurality of temperatures; and calculating a plurality of resultant mean values of current for each of the plurality of m levels with respect to each of the plurality of temperatures.

10. A system for performing a voltage-based measurement of a resistive memory cell having a plurality m of programmable cell states, the system comprising:
a processor configured to:
provide a prebiased voltage at a connecting node coupled to the resistive memory cell;
prebias a bitline capacitance of the resistive memory cell;
settle a sensing circuit to a target voltage; and
output a resultant value based on a sensed voltage.

11. The system of claim 10, further comprising a temperature sensor configured to provide the sensed temperature reading.

12. The system of claim 11, wherein the temperature sensor is configured to read a temperature for a plurality of memory cells organized as a memory storage bank.

13. The system of claim 11, wherein the sensor is configured to read a temperature at a plurality of memory storage banks.

14. The system of claim 10, wherein the resultant value is substantially constant at all temperatures within a predetermined range of operational temperatures.

15. The system of claim 14, wherein a substantially constant resultant value is within a predefined range of mean square error.

16. The system of claim 15, wherein the processor is configured to:
monitor the resistive memory cell at the end of a predetermined time period;
vary a temperature at the resistive memory cell to a predetermined temperature, wherein the temperature is predetermined with respect to a reference temperature;
read a current at an output of the resistive memory cell at a mean enhanced voltage-metric value for each of the plurality of m levels;
calculate a resultant mean value of current for each of the plurality of m levels at the end of the predetermined time period; and
determine an optional detection curve based on the calculated value and a mean enhanced voltage-metric value for each of the plurality of m levels.

17. The system of claim 16, wherein the processor is further configured to:
read the current at the output of each of a plurality of memory cells at a mean enhanced voltage-metric value for each of the plurality of m levels at a plurality of temperatures; and
calculate a plurality of resultant mean values of current for each of the plurality of m levels with respect to each of the plurality of temperatures.

18. A computer program product for performing a voltage-based measurement, the computer program product comprising a computer readable storage medium having program instructions embodied therewith, wherein the computer readable storage medium is not a transitory signal per se, the program instructions being executable by a processor to cause the processor to perform a method, the method comprising:
providing, via the processor, a prebiased voltage at a connecting node coupled to a resistive memory cell;
prebiasing a bitline capacitance of the resistive memory cell;
settling, via the processor, a sensing circuit to a target voltage; and
outputting a resultant value based a sensed voltage.

19. The computer program product of claim 18, wherein settling the sensing circuit comprises reading a temperature sensor to determine the temperature reading.

20. The computer program product of claim 19, wherein the temperature sensor is configured to read a temperature of a plurality of memory cells organized as a memory storage bank.

* * * * *